(12) United States Patent
Kim et al.

(10) Patent No.: US 10,403,739 B2
(45) Date of Patent: Sep. 3, 2019

(54) METHOD FOR FABRICATING SEMICONDUCTOR DEVICE

(71) Applicant: SAMSUNG ELECTRONICS CO., LTD., Suwon-si, Gyeonggi-do (KR)

(72) Inventors: Tea Won Kim, Hwaseong-si (KR); Yong Suk Tak, Seoul (KR); Ki Yeon Park, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/865,531

(22) Filed: Jan. 9, 2018

(65) Prior Publication Data

US 2019/0006485 A1 Jan. 3, 2019

(30) Foreign Application Priority Data

Jun. 29, 2017 (KR) .................. 10-2017-0082278

(51) Int. Cl.
 *H01L 29/66* (2006.01)
 *H01L 29/06* (2006.01)

(52) U.S. Cl.
 CPC ...... *H01L 29/6656* (2013.01); *H01L 29/0673* (2013.01); *H01L 29/6653* (2013.01); *H01L 29/66545* (2013.01); *H01L 29/66795* (2013.01)

(58) Field of Classification Search
 CPC .................................................. H01L 29/6653
 See application file for complete search history.

(56) References Cited

U.S. PATENT DOCUMENTS

| | | | |
|---|---|---|---|
| 8,384,069 B2 | 2/2013 | Pernel et al. | |
| 9,431,512 B2 | 8/2016 | Koh et al. | |
| 9,472,414 B2 | 10/2016 | Yang et al. | |
| 9,484,447 B2 | 11/2016 | Kim et al. | |
| 9,570,609 B2 | 2/2017 | Obradovic et al. | |
| 9,647,071 B2 * | 5/2017 | Peng ................. | H01L 21/30604 |
| 9,660,028 B1 * | 5/2017 | Cheng ................ | H01L 29/0673 |
| 9,799,748 B1 * | 10/2017 | Xie .................... | H01L 21/30604 |
| 9,941,405 B2 * | 4/2018 | Kittl .................... | H01L 29/7848 |
| 2017/0069481 A1 | 3/2017 | Doris et al. | |
| 2017/0236900 A1 * | 8/2017 | Chang ................ | H01L 29/0673 257/347 |

FOREIGN PATENT DOCUMENTS

| | | |
|---|---|---|
| KR | 10-2008-0059774 A | 7/2008 |
| KR | 10-0877257 B1 | 12/2008 |

* cited by examiner

*Primary Examiner* — Walter H Swanson
(74) *Attorney, Agent, or Firm* — Lee & Morse, P.C.

(57) ABSTRACT

A method for fabricating a semiconductor device includes forming a stacked structure including at least one sacrificial layer and at least one semiconductor layer alternately stacked on a substrate, forming a dummy gate structure on the stacked structure, etching a recess in the stacked structure using the dummy gate structure as a mask, etching portions of the sacrificial layer exposed by the recess to form an etched sacrificial layer, forming a first spacer film on the etched sacrificial layer, forming a second spacer film on the first spacer film, the second spacer film including a material different from a material of the first spacer film, removing a first portion of the second spacer film, such that a second portion of the second spacer film remains, and forming a third spacer film on the second portion of the second spacer film.

20 Claims, 27 Drawing Sheets

METHOD FOR FABRICATING SEMICONDUCTOR DEVICE

CROSS-REFERENCE TO RELATED APPLICATION

Korean Patent Application No. 10-2017-0082278, filed on Jun. 29, 2017, in the Korean Intellectual Property Office, and entitled: "Method for Fabricating Semiconductor Device," is incorporated by reference herein in its entirety.

BACKGROUND

1. Field

The present disclosure relates to a method for fabricating a semiconductor device.

2. Description of the Related Art

A multigate transistor has been suggested as one of the scaling technologies to increase density of semiconductor devices, according to which a silicon body in a fin or a nanowire shape is formed on a substrate, with gates then being formed on a surface of the silicon body. Such a multigate transistor allows easy scaling, as it uses a three-dimensional channel. Further, current control capability can be enhanced without requiring increased gate length of the multigate transistor. Furthermore, it is possible to effectively suppress short channel effect (SCE), i.e., a phenomenon in which the electric potential of a channel region is influenced by a drain voltage.

SUMMARY

According to an exemplary embodiment of the present disclosure, there is provided a method for fabricating a semiconductor device that includes forming a stacked structure where a sacrificial layer and a semiconductor layer are alternately stacked on a substrate, forming a dummy gate structure on the stacked structure, forming a recess by etching the stacked structure using the dummy gate structure as a mask. etching a portion of the sacrificial layer exposed by the recess, forming a first spacer film on etched the sacrificial layer, forming on the first spacer film a second spacer film that includes a material different from the first spacer film, removing a portion of the second spacer film, and forming a third spacer film on remaining the second spacer film.

According to an exemplary embodiment of the present disclosure, there is also provided a method for fabricating a semiconductor device that includes forming a stacked structure where a sacrificial layer and a semiconductor layer are alternately stacked on a substrate, forming a dummy gate structure on the stacked structure, forming a recess by etching the stacked structure using the dummy gate structure as a mask, forming a first exposed region between a plurality of the semiconductor layers by etching a portion of the sacrificial layer, conformally forming a first spacer film on the sacrificial layer and the semiconductor layer of the first exposed region, to form a second exposed region between the first spacer film, conformally forming a second spacer film on the first spacer film of the second exposed region, forming a third exposed region by etching a portion of the second spacer film formed in the second exposed region, and forming a third spacer film on the first and second spacer films of the third exposed region.

According to an exemplary embodiment of the present disclosure, there is also provided a method for fabricating a semiconductor device that includes forming a stacked structure where a sacrificial layer and a semiconductor layer are alternately stacked on a substrate, forming a dummy gate on the stacked structure, forming a dummy gate spacer on a sidewall of the dummy gate, forming a recess by etching the stacked structure using the dummy gate and the dummy gate spacer as a mask, etching a portion of the sacrificial layer exposed by the recess, removing the dummy gate spacer, conformally forming a first spacer film on the dummy gate, the semiconductor layer and the sacrificial layer, conformally forming on the first spacer film a second spacer film that includes a material different from the first spacer film, removing the second spacer film excluding a portion of the second spacer film formed on a side surface of the sacrificial layer, and forming a third spacer film on the first spacer film and the second spacer film.

BRIEF DESCRIPTION OF THE DRAWINGS

Features will become apparent to those of skill in the art by describing in detail exemplary embodiments with reference to the attached drawings, in which.

DETAILED DESCRIPTION

Herein below, a semiconductor device according to some exemplary embodiments of the present disclosure will be described with reference to FIG. 1 to FIG. 4.

Figure 1:
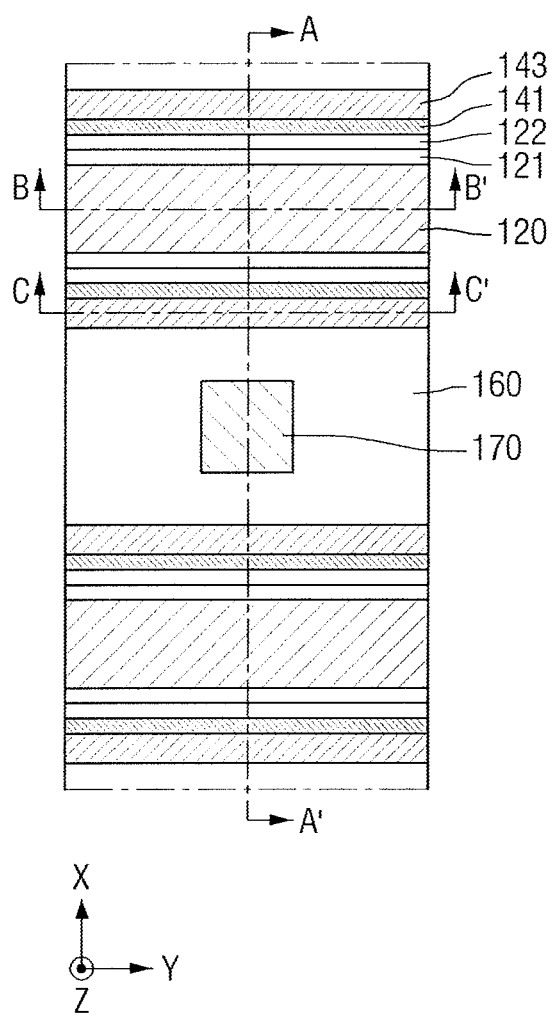
FIG. 1 illustrates a plan view of a semiconductor device according to some exemplary embodiments of the present disclosure.
Figure 2:
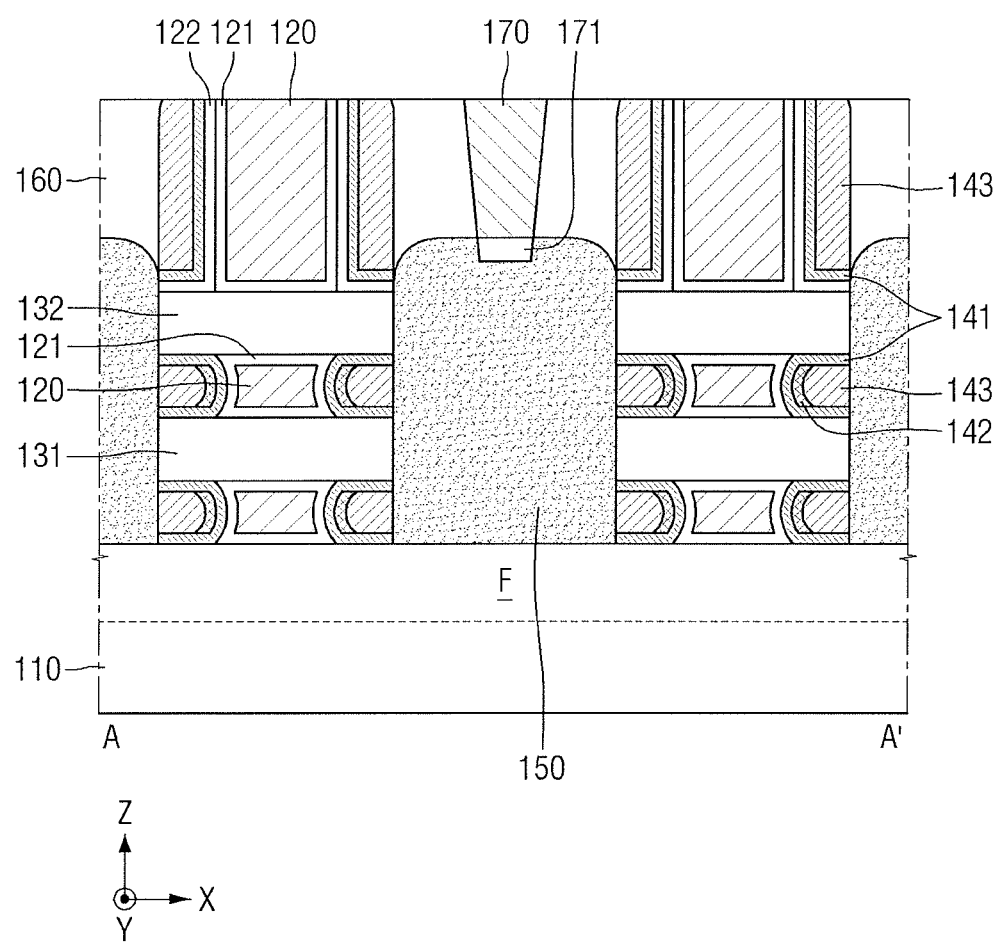
FIG. 2 illustrates a cross-sectional view taken along line A-A' of FIG. 1.
Figure 3:
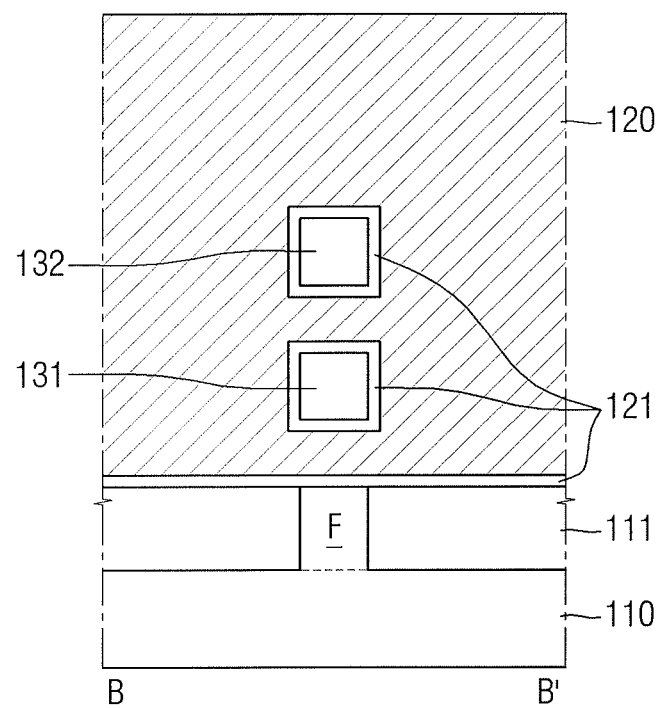
FIG. 3 illustrates a cross-sectional view taken along line B-B' of FIG. 1.
Figure 4:
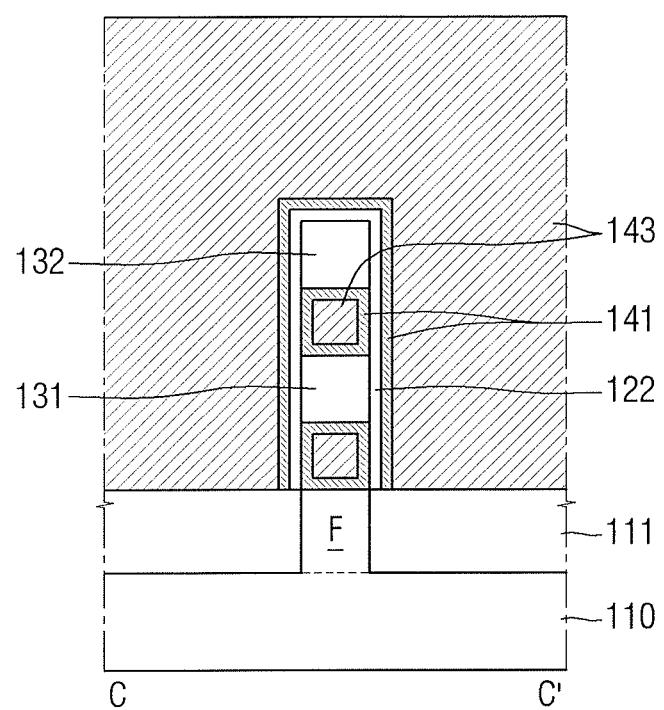
FIG. 4 illustrates a cross-sectional view taken along line C-C' of FIG. 1.

FIG. 1 is a plan view illustrating a semiconductor device according to some exemplary embodiments of the present disclosure. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1.

Referring to FIG. 1 to FIG. 4, a semiconductor device according to some exemplary embodiments of the present disclosure may include a substrate 110, a fin-type pattern F, a field insulating film 111, a gate electrode 120, a gate insulating film 121, an insulating film 122, a first nanowire 131, a second nanowire 132, a first spacer 141, a second spacer 142, a third spacer 143, a source/drain region 150, an interlayer insulating film 160, a contact 170, and a silicide film 171.

The substrate 110 may be, e.g., a bulk silicon or a silicon-on-insulator (SOI. In another example, the substrate 110 may be a silicon substrate, or may include other materials, e.g., silicon germanium, indium antimonide, lead telluride compound, indium arsenide, indium phosphide, gallium arsenide, or gallium antimonide. In yet another example, the substrate 110 may be a base substrate having an epitaxial layer formed thereon.

Further, the substrate 110 may include the fin-type pattern F. The fin-type pattern F may be formed to protrude from the substrate 110. The field insulating film 111 may surround at least a portion of a sidewall of the fin-type pattern F. The fin-type pattern F may be defined by the field insulating film 111. The field insulating film 111 may include one of, e.g., oxide film, nitride film, oxynitride film, and a combination thereof. Although it is illustrated in FIG. 3 that the sidewall of the fin-type pattern F may be entirely surrounded by the field insulating film 111, this is only for convenience of explanation, and thus the present disclosure is not limited thereto.

The fin-type pattern F may extend longitudinally in a first direction X. That is, the fin-type pattern F may include a long side extending in the first direction X, and a short side extending in a second direction Y.

The fin-type pattern F may be formed by etching a portion of the substrate 110, and may include an epitaxial layer grown from the substrate 110. The fin-type pattern F may include an element semiconductor material, e.g., silicon or germanium. Further, the fin-type pattern F may include a compound semiconductor, e.g., a IV-IV group compound semiconductor or a III-V group compound semiconductor.

For example, the IV-IV group compound semiconductor may include a binary compound or a ternary compound including at least two or more of, e.g., carbon (C), silicon (Si), germanium (Ge), and tin (Sn), or the aforementioned binary or ternary compound doped with a IV group element. In another example, the III-V group compound semiconductor may include one of a binary compound, a ternary compound, and a quaternary compound, formed by combining a III group element. e.g., at least one of aluminum (Al), gallium (Ga), and indium (In), with a V group element. e.g., one of phosphorus (P), arsenic (As) and antimony (Sb). In the semiconductor device according to some exemplary embodiments, it is assumed that the fin-type pattern F includes silicon.

FIG. 2 to FIG. 4 provide exemplary illustrations where the semiconductor device includes two nanowires, i.e. a first nanowire 131 and a second nanowire 132, stacked in a third direction Z, but the present disclosure is not limited thereto. That is, in some other exemplary embodiments, the semiconductor device may include one nanowire. Further, in yet some other exemplary embodiments, the semiconductor device may include three or more nanowires. In the following description, it is exemplarily described that the semiconductor device includes two nanowires stacked in the third direction Z.

Referring to FIGS. 2-4, the first nanowire 131 may be formed on the substrate 110 such that it is spaced apart from the substrate 110 in the third direction Z. The first nanowire 131 may be formed to extend in the first direction X. In detail, the first nanowire 131 may be formed on the fin-type pattern F, such that it is spaced apart from the fin-type pattern F in the third direction Z. The first nanowire 131 may be overlapped with the fin-type pattern F.

Although it is illustrated in FIG. 3 that the width of the first nanowire 131 in the second direction Y may be identical to the width of the fin-type pattern F in the second direction Y, this is only for convenience of explanation, and thus the present disclosure is not limited thereto. Further, although it is illustrated that the first nanowire 131 has a rectangular cross-section, the present disclosure is not limited thereto, e.g., a corner portion of the first nanowire 131 may be rounded by a trimming process, and the like.

The first nanowire 131 may be used as a channel region of a transistor. The first nanowire 131 may differ depending on whether the semiconductor device is a PMOS or an NMOS, but the present disclosure is not limited thereto.

Further, the first nanowire 131 may include the same material as the fin-type pattern F, or include a material different from the fin-type pattern F. However, for convenience of explanation, it will be assumed herein that the first nanowire 131 of the semiconductor device according to the exemplary embodiments of the present disclosure includes silicon.

The second nanowire 132 may be formed on the substrate 110 such that it is spaced apart from the substrate 110 in the third direction Z. The second nanowire 132 may be formed to extend in the first direction X.

The second nanowire 132 may be spaced apart from the substrate 110 farther than the first nanowire 131 is spaced apart from the substrate 110. That is, the height from an upper surface of the fin-type pattern F to the second nanowire 132 is greater than the height from the upper surface of the fin-type pattern F to the first nanowire 131.

The second nanowire 132 may be overlapped with the fin-type pattern F. The second nanowire 132 may be used as a channel region of the transistor. Therefore, the second nanowire 132 may include the same material as the first nanowire 131.

The gate electrode 120 may be formed on the field insulating film 111 and the fin-type pattern F. The gate electrode 120 may extend in the second direction Y.

Referring to FIG. 3, the gate electrode 120 may be formed such that it surrounds the circumference of each of the first nanowire 131 and the second nanowire 132 that are spaced apart from the upper surface of the fin-type pattern F. The gate electrode 120 may also be formed in a space defined between the fin-type pattern F and the first nanowire 131. Further, the gate electrode 120 may also be formed in a space defined between the first nanowire 131 and the second nanowire 132.

Although it is illustrated in FIG. 2 to FIG. 4 that sidewalls of each gate electrode 120 formed between the fin-type pattern F and the first nanowire 131 and between the first nanowire 131 and the second nanowire 132, have shapes indented concavely in the first direction X, the present disclosure is not limited thereto.

The gate electrode 120 may include a conductive material. Although it is illustrated that the gate electrode 120 is a single layer, the present disclosure is not limited thereto.

That is, in some other exemplary embodiments, the gate electrode 120 may include a work function conductive layer that adjusts work function, and a filling conductive layer that fills a space formed by the work function adjustment layer. The gate electrode 120 may include at least one of, e.g., TiN, WN, TaN, Ru, TiC, TaC, Ti, Ag, Al, TiAl, TiAlN, TiAlC, TaCN, TaSiN, Mn, Zr, W, and Al. Alternatively, the gate electrode 120 may be made of a non-metal element, e.g., Si, SiGe, and the like. For example, such a gate electrode 120 may be formed through a replacement process, but the present disclosure is not limited thereto.

The gate insulating film 121 may be formed between the first nanowire 131 and the gate electrode 120, and between the second nanowire 132 and the gate electrode 120, e.g., the gate insulating film 121 may completely separate each of the first and second nanowires 131 and 132 from the gate electrode 120. Further, the gate insulating film 121 may be formed between the field insulating film 111 and the gate electrode 120, between the fin-type pattern F and the gate electrode 120, between the insulating film 122 and the gate electrode 120, and between the first spacer 141 and the gate electrode 120.

That is, the gate insulating film 121 may be formed along the circumference of each of the first and second nanowires 131, 132. Further, the gate insulating film 121 may be formed along the upper surface of the field insulating film 111 and the upper surface of the fin-type pattern F. Further, the gate insulating film 121 may be formed along the sidewall of the first spacer 141 and the insulating film 122.

The gate insulating film 121 may include an interfacial film and a high-k insulating film, for example, but the present disclosure is not limited thereto. That is, depending on the material of the first and second nanowires 131, 132, the interfacial film of the gate insulating film 121 may be omitted. In a case where the first and second nanowires 131, 132 include silicon, the interfacial film may include a silicon oxide film.

The high-k insulating film may include a high-k dielectric material having a higher dielectric constant than the silicon oxide film. For example, the high-k dielectric material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but the present disclosure is not limited thereto. In the case where the interfacial film is omitted, the high-k insulating film may include not only the aforementioned high-k dielectric material, but also, e.g., a silicon oxide film, a silicon oxynitride film, or a silicon nitride film and the like.

The insulating film 122 may be formed between the gate insulating film 121 and first spacer 141, between the first spacer 141 and the first nanowire 131, and between the first spacer 141 and the second nanowire 132. The insulating film 122 may include, e.g., silicon oxycarbonitride (SiOCN), but the present disclosure is not limited thereto.

The first spacer 141 may be conformally formed on the insulating film 122 formed on both sidewalls of the gate electrode 120 extending in the second direction Y. Further, between the fin-type pattern F and the first nanowire 131, the first spacer 141 may be conformally formed along the surface of the fin-type pattern F, the gate insulating film 121, and the first nanowire 131. Further, between the first nanowire 131 and the second nanowire 132, the first spacer 141 may be conformally formed along the surface of the first nanowire 131, the gate insulating film 121, and the second nanowire 132.

The first spacer 141 may include, e.g., silicon carbonitride (SiCN). However, the present disclosure is not limited thereto. That is, in some other exemplary embodiments, the first spacer 141 may include, e.g., at least one of silicon nitride (SiN), silicon oxynitride (SiON), silicon oxide (SiO$_2$), silicon oxycarbonitride (SiOCN), and a combination thereof.

Between the fin-type pattern F and the first nanowire 131, the second spacer 142 may be formed on the first spacer 141 and adjacently to the gate insulating film 121. Further, between the first nanowire 131 and the second nanowire 132, the second spacer 142 may be formed on the first spacer 141 and adjacently to the gate insulating film 121. For example, as illustrated in FIG. 2, in a region below the second nanowire 132, the second spacer 142 may be, e.g., only, on a portion of the first spacer 141 that overlaps the gate insulating film 121, e.g., the second spacer 142 may be directly between the first and third spacers 141 and 143 in a region overlapping a portion of the gate insulating film 121.

As illustrated in FIGS. 2 and 4, the second spacer 142 may not be formed on the first spacer 141 formed on the insulating film 122, e.g., in a region above the second nanowire 132. However, the present disclosure is not limited thereto.

Further, the second spacer 142 may not be formed on a portion of the first spacer 141, e.g., the second spacer 142 may be formed only partially on the first spacer 141 to have some portions of the first spacer 141 without the second spacer 142. That is, the second spacer 142 may not be formed on a portion of the first spacer 141 that contacts the upper surface of the fin-type pattern F, e.g., a major surface of the second spacer 142 may not extend along a surface of the first spacer 141 that contacts the upper surface of the fin-type pattern F. Further, the second spacer 142 may not be formed on a portion of the first spacer 141 that contacts the upper surface and the lower surface of the first nanowire 131, e.g., a major surface of the second spacer 142 may not extend along a surface of the first spacer 141 that contacts the upper surface and the lower surface of the first nanowire 131. Further, the second spacer 142 may not be formed on a portion of the first spacer 141 that contacts the lower surface of the second nanowire 132, e.g., a major surface of the second spacer 142 may not extend along a surface of the first spacer 141 that contacts the lower surface of the second nanowire 132. For example, as illustrated in FIG. 2, major surfaces of the second spacer 142 may be parallel to each other and on a first part of the first spacer 141 that overlaps the gate insulating film 121, e.g., the first part of the first spacer 141 may be directly between the gate insulating film 121 and the second spacer 142. However, the present disclosure is not limited The second spacer 142 may include a material different from the first spacer 141. In detail, the second spacer 142 may include a material having an etch selectivity different from that of the first spacer 141.

For example, in the process of forming the second spacer 142, when using the wet etching process in order to remove a portion of the second spacer 142, the first spacer 141 may include silicon carbonitride (SiCN), and the second spacer 142 may include silicon nitride (SiN). That is, in the case where the first spacer 141 includes silicon carbonitride (SiCN), the second spacer 142 may include, e.g., silicon nitride (SiN) having a smaller etching tolerance than silicon carbonitride (SiCN) with respect to phosphoric acid, that is an etching etchant.

Further, for example, in the process of forming the second spacer 142, when using the wet etching process in order to remove a portion of the second spacer 142, the first spacer 141 may include silicon oxycarbonitride (SiOCN), and the second spacer 142 may include silicon oxynitride (SiON). That is, in the case where the first spacer 141 includes silicon oxycarbonitride (SiOCN), the second spacer 142 may include, e.g., silicon oxynitride (SiON) having a smaller etching tolerance than silicon oxycarbonitride (SiOCN) with respect to phosphoric acid, that is an etching etchant.

However, the present disclosure is not limited thereto. That is, in some other exemplary embodiments, in the process of forming the second spacer 142, e.g., when using a dry etching process in order to remove a portion of the second spacer 142, the first spacer 141 may include silicon nitride (SiN), and the second spacer 142 may include silicon carbonitride (SiCN).

The third spacer 143 may be formed on the first spacer 141 and the second spacer 142. In detail, between the fin-type pattern F and the first nanowire 131, the third spacer 143 may be formed on the first spacer 141 and the second spacer 142, e.g., the third spacer 143 may directly contact portions of the first spacer 141 (i.e., portions of the first spacer 141 not contacting the second spacer 142) and directly contact the second spacer 142. Further, between the first nanowire 131 and the second nanowire 132, the third spacer 143 may be formed on the first spacer 141 and the second spacer 142. Further, the third spacer 143 may be formed on the first spacer 141 formed on the insulating film 122, e.g., the third spacer 143 may be formed directly on the first spacer 141 in a region above the second nanowire 132.

The third spacer 143 may include the same material as the second spacer 142. For example, in the case where the first spacer 141 includes silicon carbonitride (SiCN), the second spacer 142 and the third spacer 143 may each include silicon nitride (SiN). Further, in the case where the first spacer 141 includes silicon oxycarbonitride (SiOCN), for example, the second spacer 142 and the third spacer 143 may each include silicon oxynitride (SiON).

However, the present disclosure is not limited thereto. That is, in some other exemplary embodiments, the third spacer 143 may include a material different from the second spacer 142.

The source/drain region 150 may be formed on at least one side of the gate electrode 120. The source/drain region 150 may be formed on the first spacer 141 and the third spacer 143, e.g., the source/drain region 150 may directly contact the first spacer 141 and the third spacer 143.

An outer circumference of the source/drain region 150 may take on a variety of shapes. For example, the outer circumference of the source/drain region 150 may be at least one of a diamond shape, circle shape, rectangle shape, and octagon shape. However, the present disclosure is not limited thereto.

The source/drain region 150 may be directly connected with the first nanowire 131 and the second nanowire 132, used as the channel region. However, the source/drain region 150 may not be in direct contact with the gate insulating film 121. The first spacer 141, the second spacer 142, and the third spacer 143 may be disposed between the source/drain region 150 and the gate insulating film 121. That is, the source/drain region 150 may not be in contact with the gate insulating film 121 due to the first to third spacers 141, 142, 143.

The interlayer insulating film 160 may be formed to cover a portion of the first spacer 141, a portion of the third spacer 143, and the source/drain region 150. The contact 170 may penetrate the interlayer insulating film 160 and may be connected with the source/drain region 150. In this case, a silicide film 171 may be formed between the contact 170 and the source/drain region 150.

Hereinbelow, a method for fabricating a semiconductor device according to some exemplary embodiments of the present disclosure will be described with reference to FIG. 2 and FIG. 5 to FIG. 18.

FIG. 5 to FIG. 18 are cross-sectional views of intermediate steps illustrating a method for fabricating a semiconductor device according to some exemplary embodiments of the present disclosure. It is noted that the views in FIGS. 5-18 correspond to that in FIG. 2.

Figure 5:
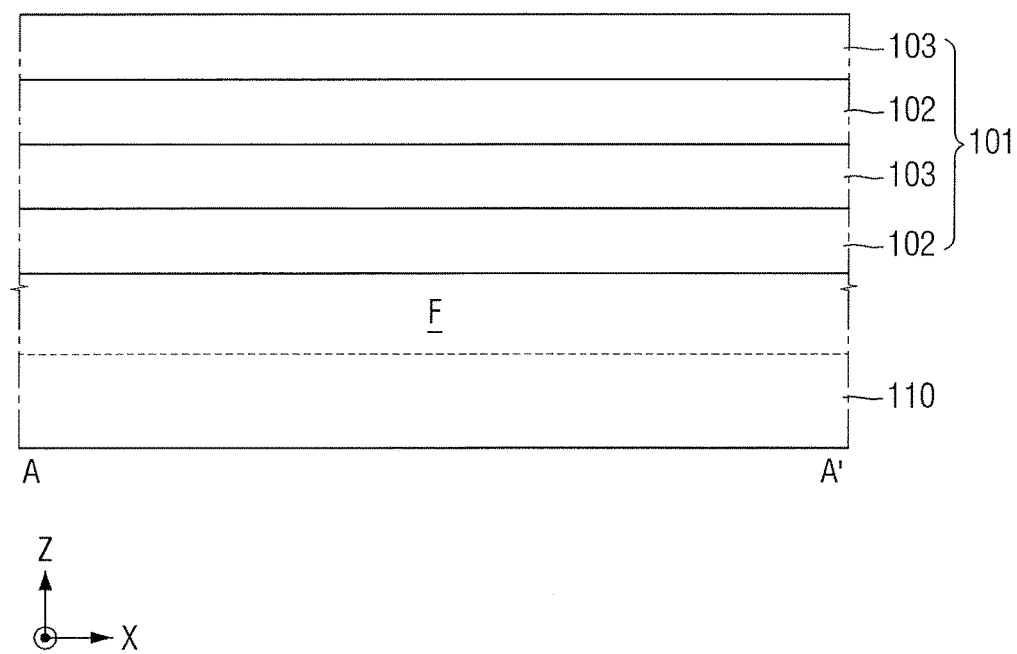
FIGS. 5 to 18 illustrate cross-sectional views of stages in a method for fabricating a semiconductor device according to some exemplary embodiments of the present disclosure.

Referring to FIG. 5, on the fin-type pattern F of the substrate 110, a stacked structure 101 is formed, where sacrificial layers 102 and semiconductor layers 103 are stacked alternately.

Each of the sacrificial layers 102 may include the same material as one another, and the sacrificial layers 102 and the semiconductor layers 103 may include different materials from each other. In describing the method for fabricating a semiconductor device according to some exemplary embodiments of the present disclosure, it is assumed that each of the sacrificial layers 102 includes the same material as one another. Further, the semiconductor layer 103 may include a material having an etch selectivity with respect to the sacrificial layer 102.

The substrate 110 and the semiconductor layer 103 may include a material that may be used as a channel region of the transistor. That is, in the case of PMOS, the semiconductor layer 103 may include a material of high hole mobility, while in the case of NMOS, the semiconductor layer 103 may include a material with high electron mobility.

The sacrificial layer 102 may include a material having a similar lattice constant and lattice structure as the semiconductor layer 103. That is, the sacrificial layer 102 may be a semiconductor material, or a crystallized metal material. In describing the method for fabricating a semiconductor device according to some exemplary embodiments of the present disclosure, it is assumed that the semiconductor layer 103 includes silicon, and the sacrificial layer 102 includes silicon germanium, respectively.

Although it is illustrated in FIG. 5 that there are two semiconductor layers 103, this is only for convenience of explanation, and thus the present disclosure is not limited thereto. That is, the sacrificial layers 102 and the semiconductor layers 103 may alternately form a plurality of pairs, and on an uppermost sacrificial layer 102, the semiconductor layer 103 may be formed.

Further, although it is illustrated in FIG. 5 that the semiconductor layer 103 is disposed on the uppermost portion of the stacked structure 101, the present disclosure is not limited thereto. Accordingly, in some other exemplary embodiments, the sacrificial layer 102 may be disposed on the uppermost portion of the stacked structure 101.

Figure 6:
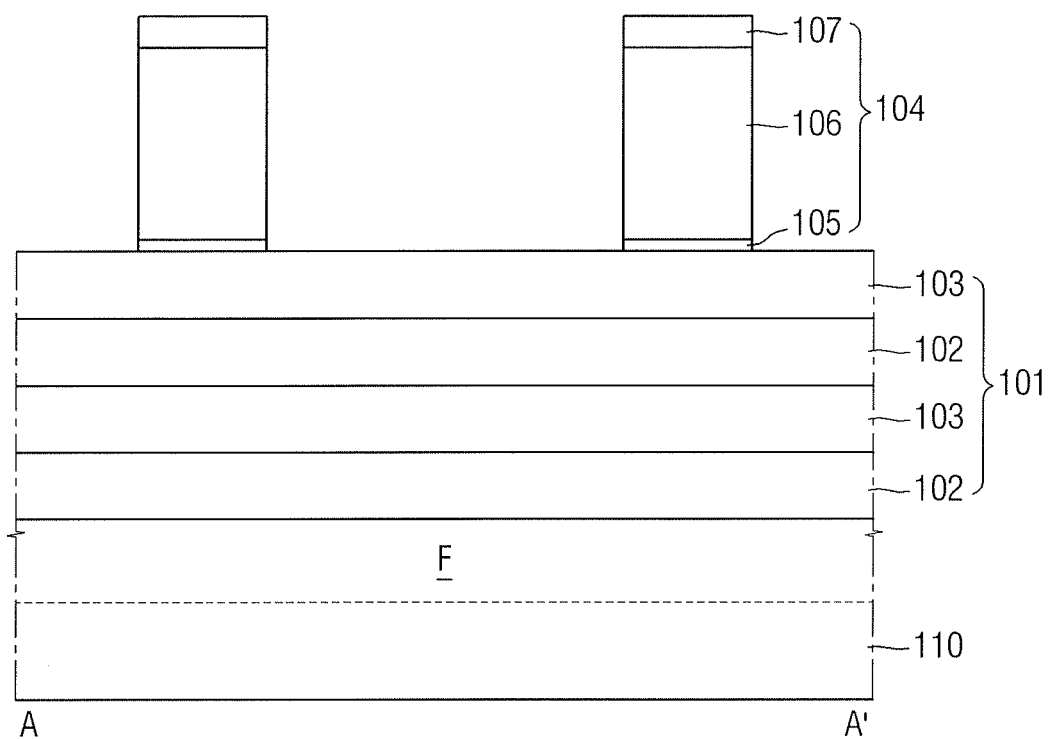
Figure 6:
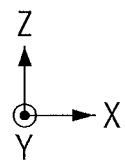

Referring to FIG. 6, by performing an etching process using a mask pattern 107, a dummy gate structure 104 may be formed on the stacked structure 101 to intersect with the stacked structure 101 and extend in the second direction Y. The dummy gate structure 104 may include a dummy gate insulating film 105, a dummy gate 106, and the mask pattern 107.

In this case, the dummy gate insulating film 105 may be formed between the stacked structure 101 and the dummy gate 106. The dummy gate insulating film 105 may include, e.g., a silicon oxide film, and the dummy gate 106 may include, e.g., polysilicon or amorphous silicon.

Figure 7:
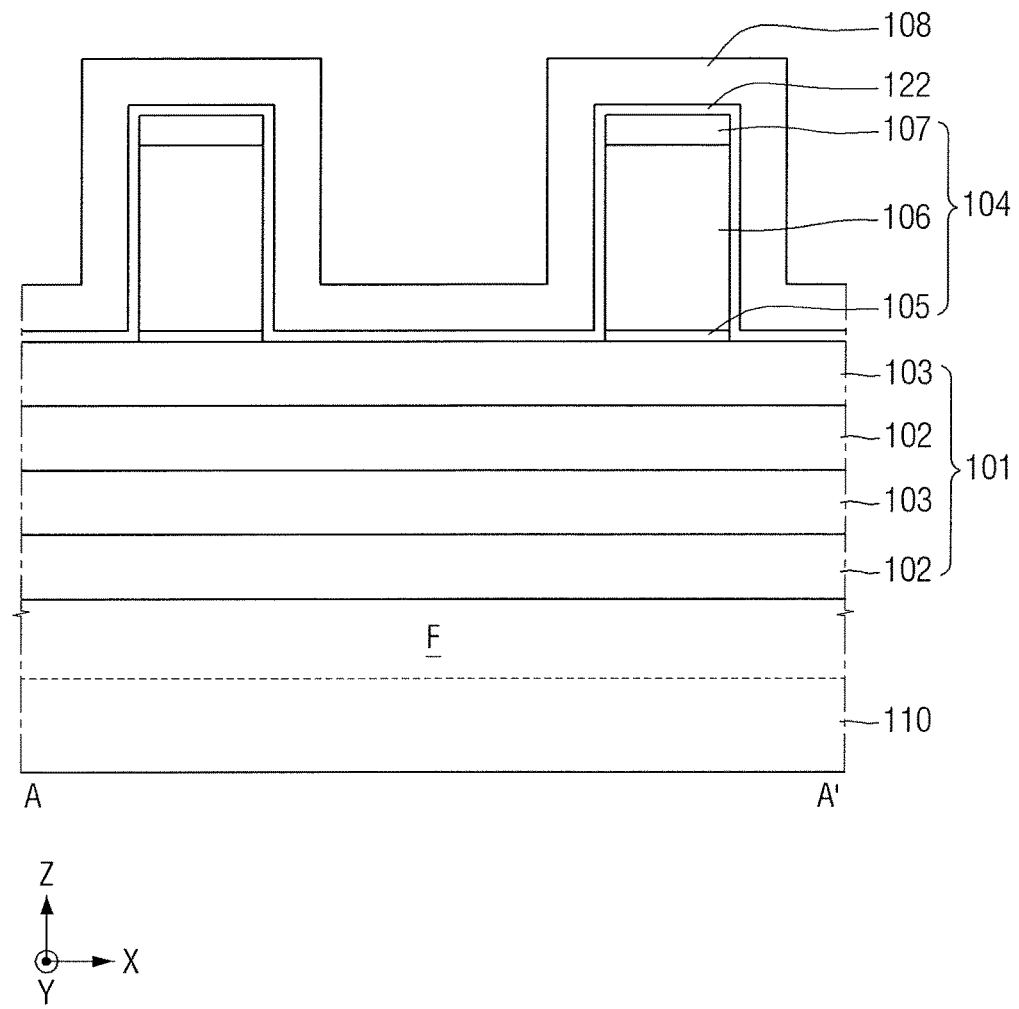

Referring to FIG. 7, the insulating film 122 is deposited to cover, e.g., conformally, the upper surface of the stacked structure 101, the side surface of the dummy gate insulating film 105, the side surface of the dummy gate 106, and the mask pattern 107. The insulating film 122 may include, e.g., silicon oxycarbonitride (SiOCN), but the present disclosure is not limited thereto.

A dummy gate spacer film 108 is conformally deposited on the insulating film 122. The dummy gate spacer film 108 may include, e.g., silicon oxide (SiO$_2$), but the present disclosure is not limited thereto.

Figure 8:
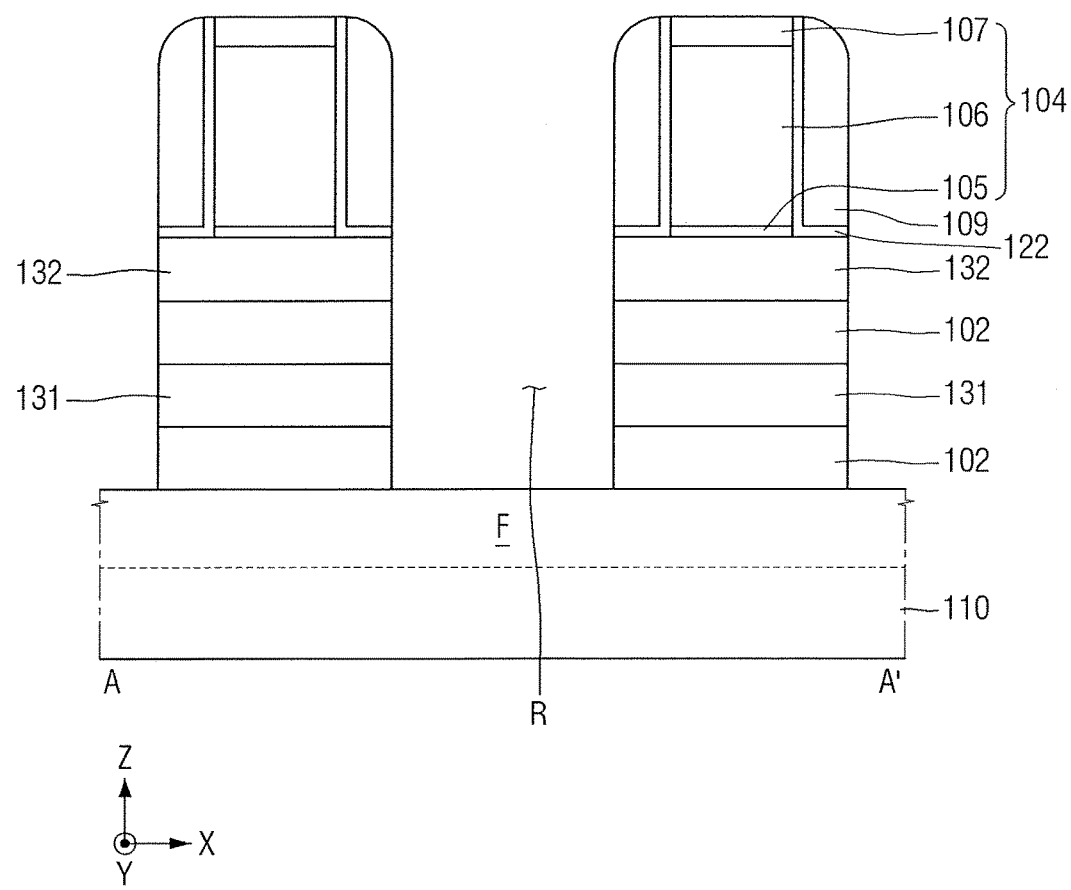

Referring to FIG. 8, the dummy gate spacer film 108 may be etched-back to form a dummy spacer 109 on both sidewalls of the dummy gate 106. Then, the dummy spacer 109 and the dummy gate structure 104 may be used as a mask to etch the stacked structure 101 and form a recess R. For example, as illustrated in FIG. 8, the recess R may extend through the stacked structure 101 to expose a portion of an upper surface of the fin-type pattern F.

Due to the aforementioned, the first nanowire 131 may be formed between two sacrificial layers 102, e.g., the first nanowire 131 may be between two sacrificial layers 102 adjacent to each other along the Z direction. The second nanowire 132 may be formed between a sacrificial layer 102 and the dummy gate structure 104, e.g., the second nanowire 132 may be between a topmost sacrificial layer 102 and the dummy gate structure 104.

Figure 9:
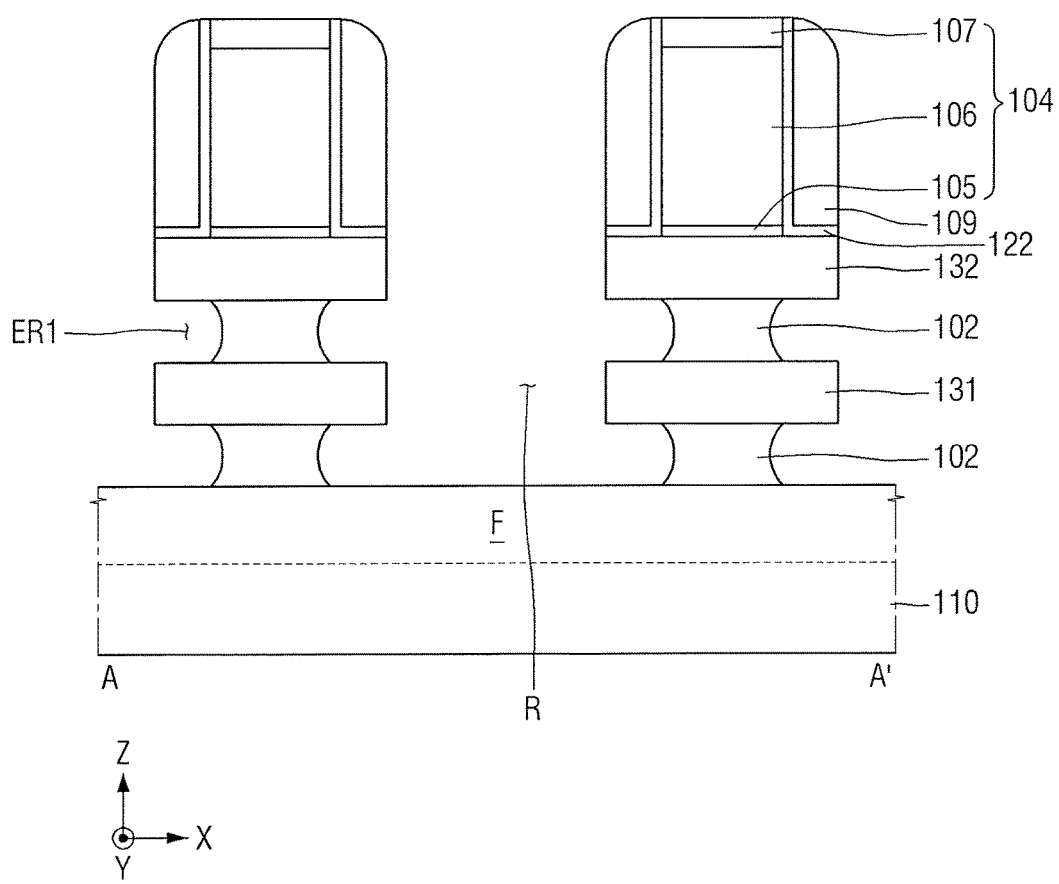

Referring to FIG. 9, a portion of the sacrificial layer 102 exposed by the recess may be etched. Due to the aforementioned, the etched sacrificial layer 102 may have a shape indented concavely in the first direction X farther than the cross-section of the first and second nanowires 131, 132 exposed by the recess R. For example, as illustrated in FIG. 9, peripheral portions of the sacrificial layer 102 exposed by the recess R may be etched, e.g., removed, to have lateral edges of the sacrificial layer 102 spaced apart from corresponding lateral edges of the first and second nanowires 131, 132 exposed by the recess R, e.g., so a total width along the first direction X of each remaining sacrificial layer 102 may be smaller than a corresponding total width along the first direction X of each of the first and second nanowires 131, 132. An empty space defined by the removed portions of the sacrificial layer 102, e.g., an empty space adjacent to the sacrificial layer 102 and between the first and second nanowires 131 and 132, may be defined as a first exposed region ER1.

The first exposed region ER1 may be formed between a plurality of semiconductor layers, i.e., between the first nanowire 131 and the second nanowire 132. Further, the first exposed region ER1 may also be formed between the fin-type pattern F and the first nanowire 131.

The process of forming the first exposed region ER1 may be performed using, e.g., a selective etching process. In detail, the process of forming the first exposed region ER1 may be performed through an etching process using an etchant having a higher etching speed for the sacrificial layer 102, than for the first and second nanowires 131, 132. Although it is illustrated in FIG. 9 that the side surface of the sacrificial layer 102 is etched in a curved surface shape, in some other exemplary embodiments, the side surface of the sacrificial layer 102 may have a plane shape.

Figure 10:
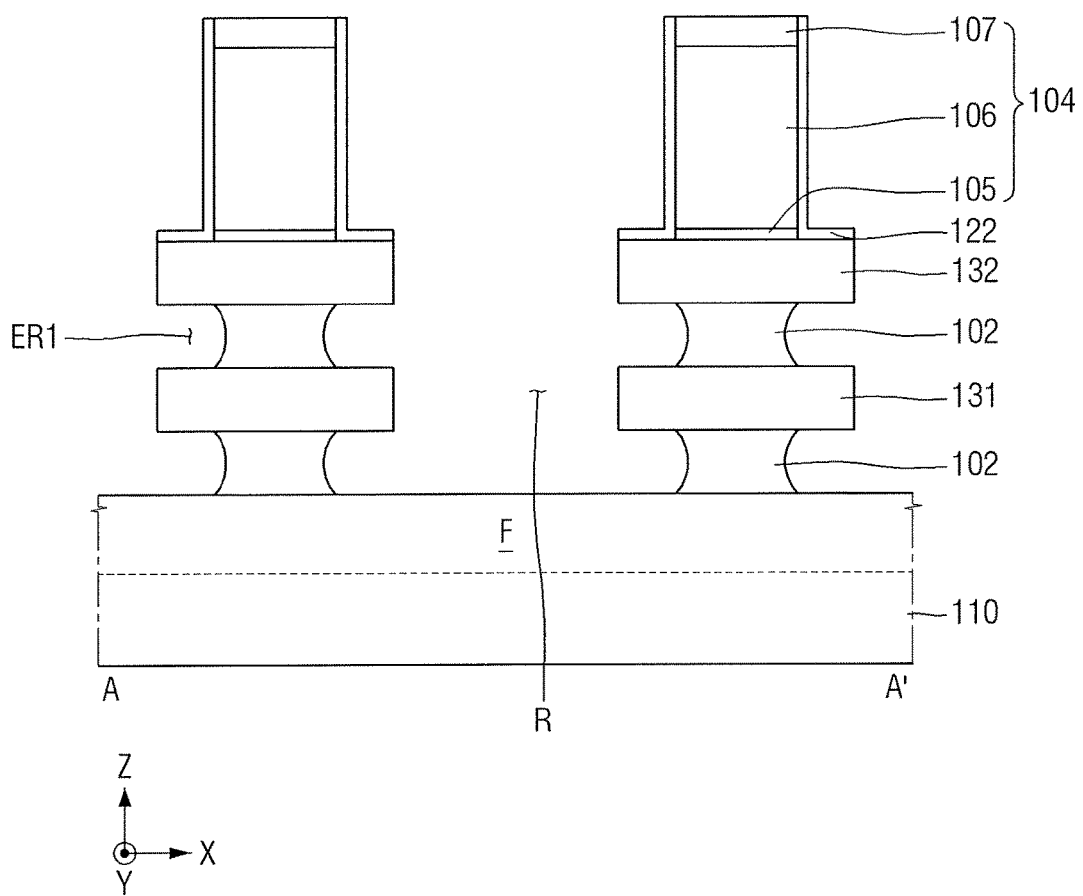
Figure 11:
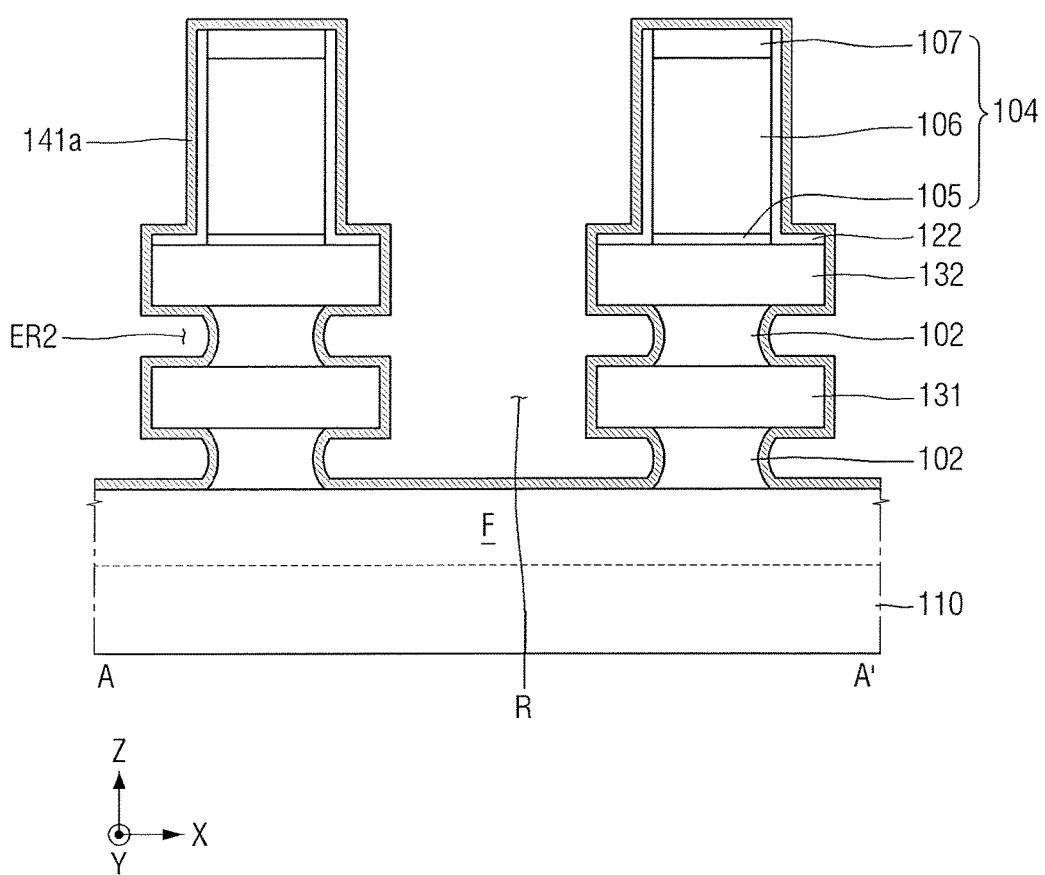

Referring to FIG. 10, the dummy spacer 109 may be removed. Next, as illustrated in FIG. 11, a first spacer film 141a may be conformally formed along the profile of the insulating film 122, the upper surface of the mask pattern 107, the side wall of the first and second nanowires 131, 132, the side wall of the sacrificial layer 102 and the upper surface of the fin-type pattern F.

The first spacer film 141a may be formed by an atomic layer deposition (ALD) method. However, the present disclosure is not limited thereto. The first spacer film 141a may include one of, e.g., silicon carbonitride (SiCN) and silicon oxycarbonitride (SiOCN), as aforementioned.

While the first spacer film 141a is being conformally formed, between the first nanowire 131 and the second nanowire 132, a second exposed region ER2 may be formed on the first spacer film 141a. Further, between the fin-type pattern F and the first nanowire 131, the second exposed region ER2 may also be formed on the first spacer film 141a. That is, the conformal structure of the first spacer film 141a in the first exposed region ER1 defines the second exposed region ER2.

Figure 12:
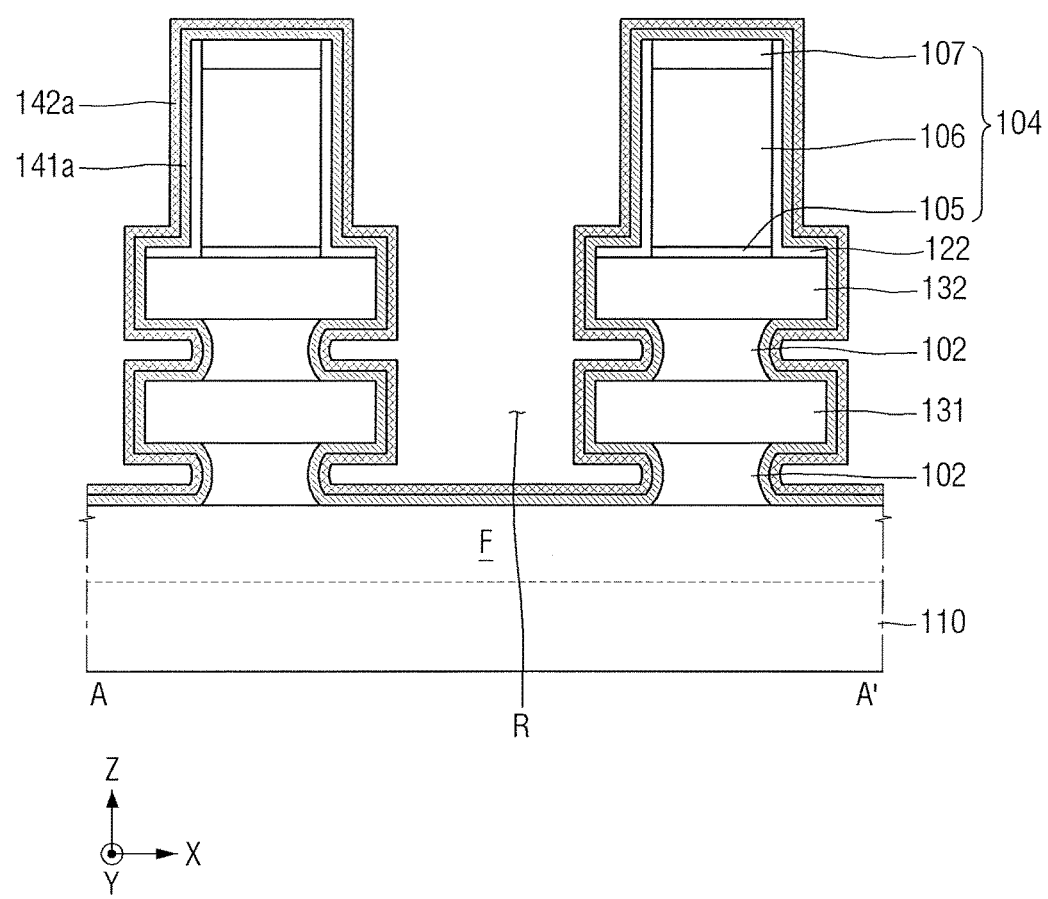

Referring to FIG. 12, a second spacer film 142a may be conformally formed on the first spacer film 141a. The second spacer film 142a may be formed by an atomic layer deposition method. However, the present disclosure is not limited thereto.

The second spacer film 142a may include a material different from that of the first spacer film 141a. For example, in the case where the first spacer film 141a includes silicon carbonitride (SiCN), the second spacer film 142a may include silicon nitride (SiN). In another example, in the case where the first spacer film 141a includes silicon oxycarbonitride (SiOCN), the second spacer film 142a may include silicon oxynitride (SiON).

Figure 13:
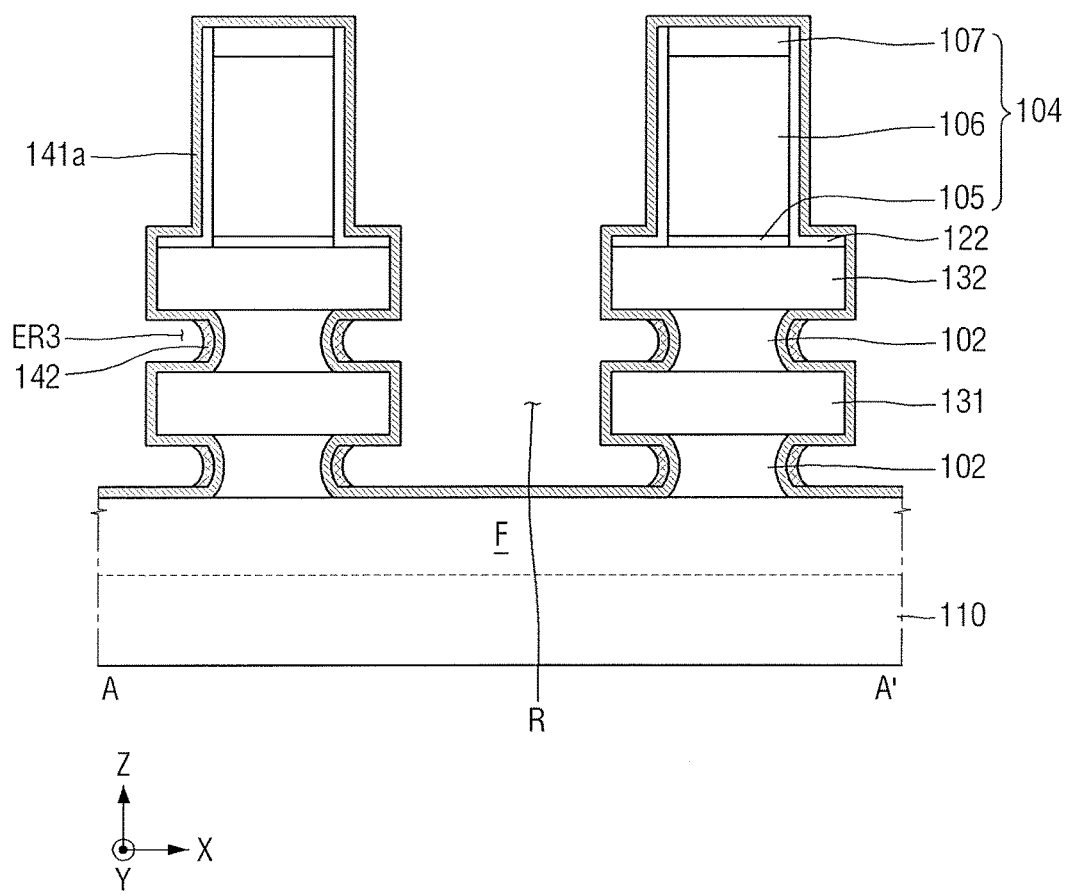

Referring to FIG. 13, a portion of the second spacer film 142a may be removed by a wet etching process to form the second spacer 142 on a portion of the first spacer film 141a of the second exposed region ER2. For example, as illustrated in FIG. 13, a majority of the second spacer film 142a may be removed, such that the second spacer 142 remains only on one surface of the second exposed region ER2, e.g., the second spacer 142 may remain only on the surface of the second exposed region ER2 that overlaps the sacrificial layer 102.

In detail, between the fin-type pattern F and the first nanowire 131, the second spacer 142 may be formed on the first spacer film 141a and adjacently to the gate insulating film 121. Further, between the first nanowire 131 and the second nanowire 132, the second spacer 142 may be formed on the first spacer film 141a and adjacently to the gate insulating film 121.

While the second spacer 142 is being formed, between the first nanowire 131 and the second nanowire 132, a third exposed region ER3 may be formed on the first spacer film 141a and the second spacer 142. Further, between the fin-type pattern F and the first nanowire 131, the third exposed region ER3 may also be formed on the first spacer film 141a and the second spacer 142.

Figure 14:
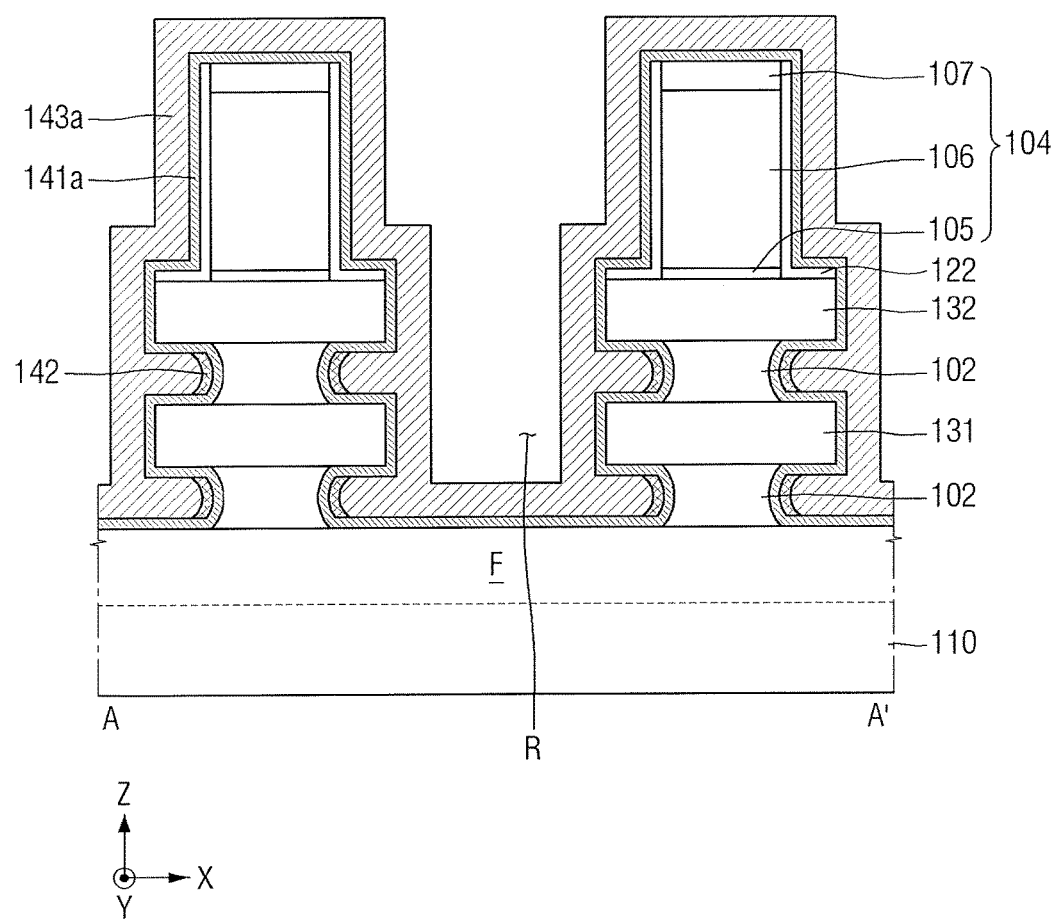

Referring to FIG. 14, a third spacer film 143a may be conformally formed on the first spacer film 141a and the second spacer 142.

The third spacer film 143a may be formed by the atomic layer deposition method. However, the present disclosure is not limited thereto.

The third spacer film 143a may include the same material as the second spacer film 142a. For example, in the case where the first spacer film 141a includes silicon carbonitride (SiCN), the second spacer film 142a and the third spacer film 143a may include silicon nitride (SiN). In another example, in the case where the first spacer film 141a includes silicon oxycarbonitride (SiOCN), the second spacer film 142a and the third spacer film 143a may include silicon oxynitride (SiON).

By sequentially depositing the first to third spacer films 141a, 142a, 143a between the partially etched sacrificial layers 102, a void can be prevented from being formed in the process of forming a spacer on the side surface of the sacrificial layers 102. In detail, by depositing the first spacer film 141a, and then depositing the second spacer film 142a having a smaller etching tolerance than the first spacer film 141a, and etching the second spacer film 142a using the wet etching process, a portion of the second spacer film 142a can remain in the second exposed region (ER2 of FIG. 11). Then, by depositing the third spacer film 143a on the first spacer film 141a and the second spacer film 142a, a void can be prevented from being formed in the process of forming the spacer on the side surface of the sacrificial layers 102. For example, as a portion of the second spacer film 142a (i.e., the second spacer 142) fills the farthest region of the second exposed region ER2, a region subsequently filled by the third spacer film 143a may be reduced (i.e., region ER3 is smaller than region ER2), thereby minimizing voids during deposition of the third spacer film 143a.

Figure 15:
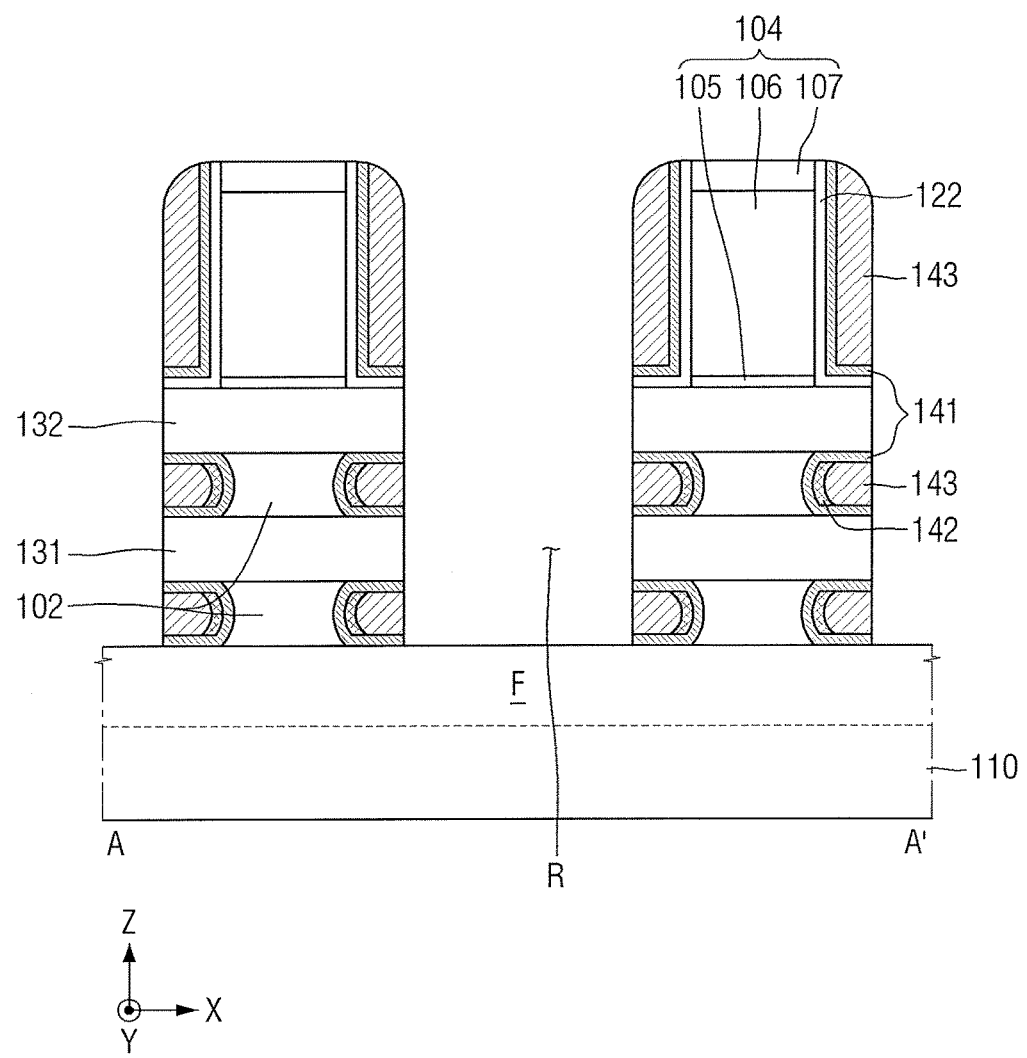

Referring to FIG. 15, the resultant structure of FIG. 14 may be etched using the mask pattern 107 and the first and third spacer films 141a, 143a formed on the sidewall of the dummy gate 106 as an etching mask. As a result, a portion of the first and third spacer films 141a, 143a formed on the sidewall of the first and second nanowires 131, 132, and a portion of the first and third spacer films 141a, 143a formed on the fin-type pattern F may be removed.

Due to the aforementioned, an external spacer can be formed that includes the first spacer 141 and the third spacer 143 on the sidewall of the dummy gate structure 104, e.g., above the second nanowire 132. Further, an internal spacer may be formed that includes the first spacer 141, the second spacer 142, and the third spacer 143 on the sidewall of each sacrificial layer 102, e.g., below the second nanowire 132.

Figure 16:
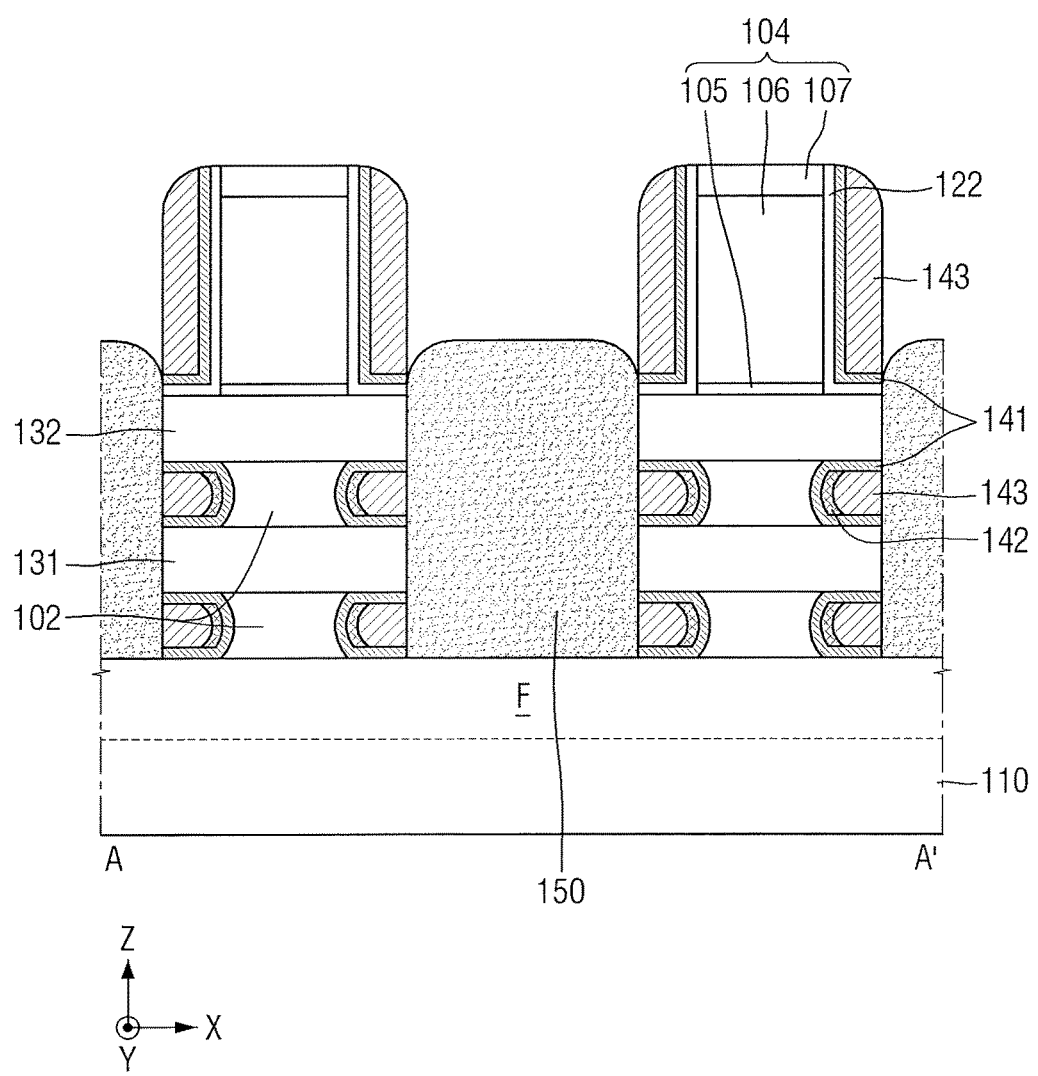

Referring to FIG. 16, the source/drain region 150 may be formed in the recess R through an epitaxial process.

Figure 17:
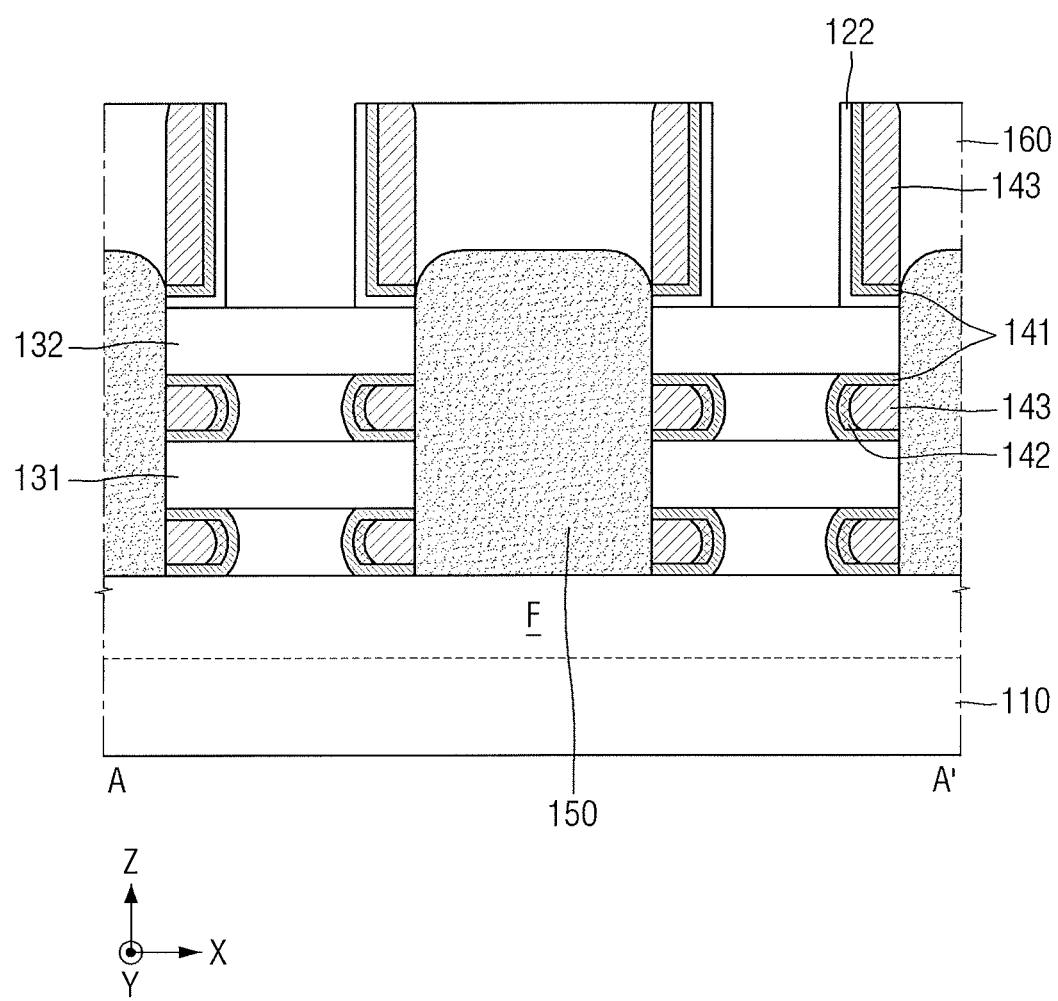

Referring to FIG. 17, on the field insulating film 111, an interlayer insulating film 160 may be formed that covers the source/drain region 150, the first spacer 141, the third spacer 143, the insulating film 122, and the mask pattern 107. Then, the mask pattern 107, the dummy gate 106, and the dummy gate insulating film 105 may be removed. Due to the aforementioned, the first nanowire 131 and the second nanowire 132 that used to be overlapped with the dummy gate 106 may be exposed, e.g., a portion of an upper surface of the second nanowire 132 may be exposed between adjacent source/drain regions 150.

Figure 18:
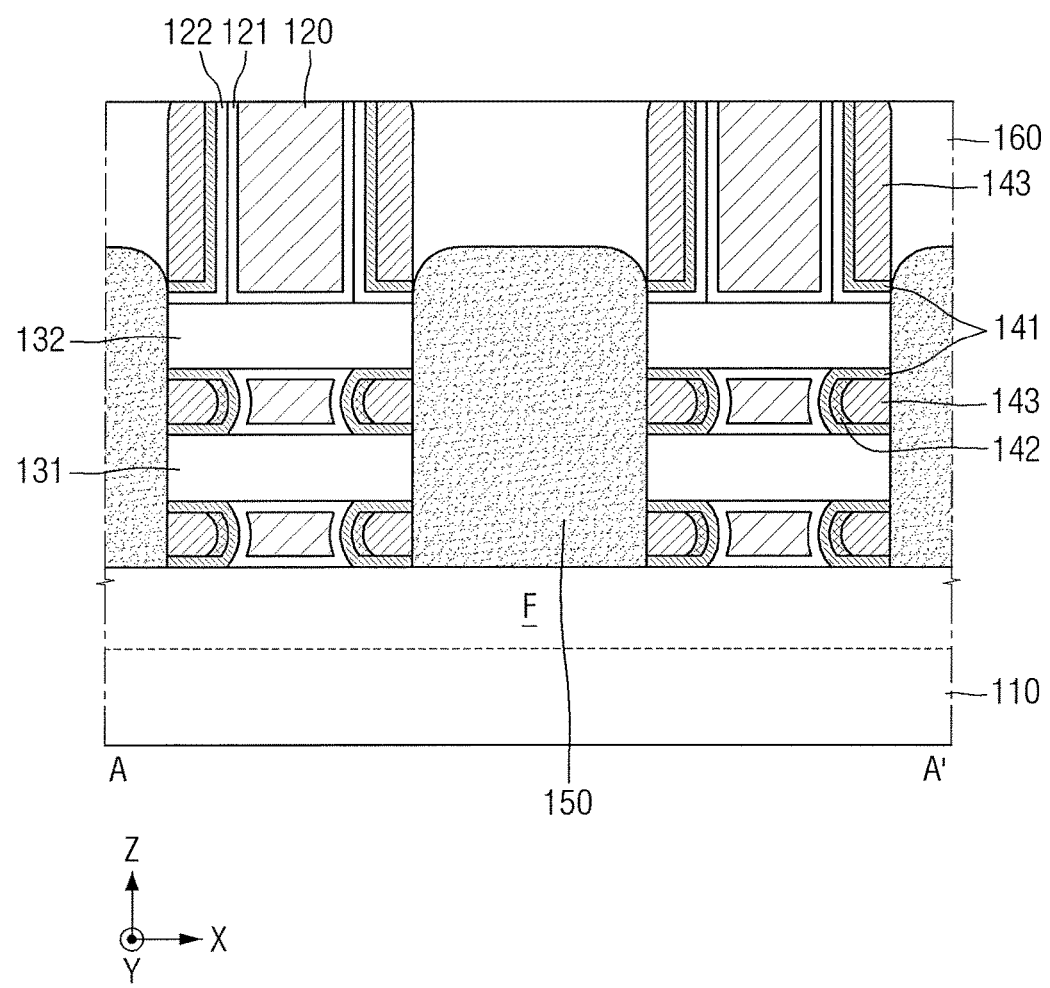

Referring to FIG. 18, the gate insulating film 121 and the gate electrode 120 may be formed in the region from which the dummy gate insulating film 105 and the dummy gate 106 have been removed, e.g., on the exposed upper surface of the second nanowire 132. Then, by forming the contact 170 and the silicide film 171 to penetrate the interlayer insulating film 160, the semiconductor device illustrated in FIG. 2 may be fabricated.

Hereinbelow, a semiconductor device and a method for fabricating the semiconductor device according to some other exemplary embodiments of the present disclosure will be described with reference to FIG. 19 and FIG. 20. The main focus of the explanation will be on the differences between the embodiment in FIGS. 19-20 and that in FIG. 2 and FIGS. 5-18.

Figure 19:
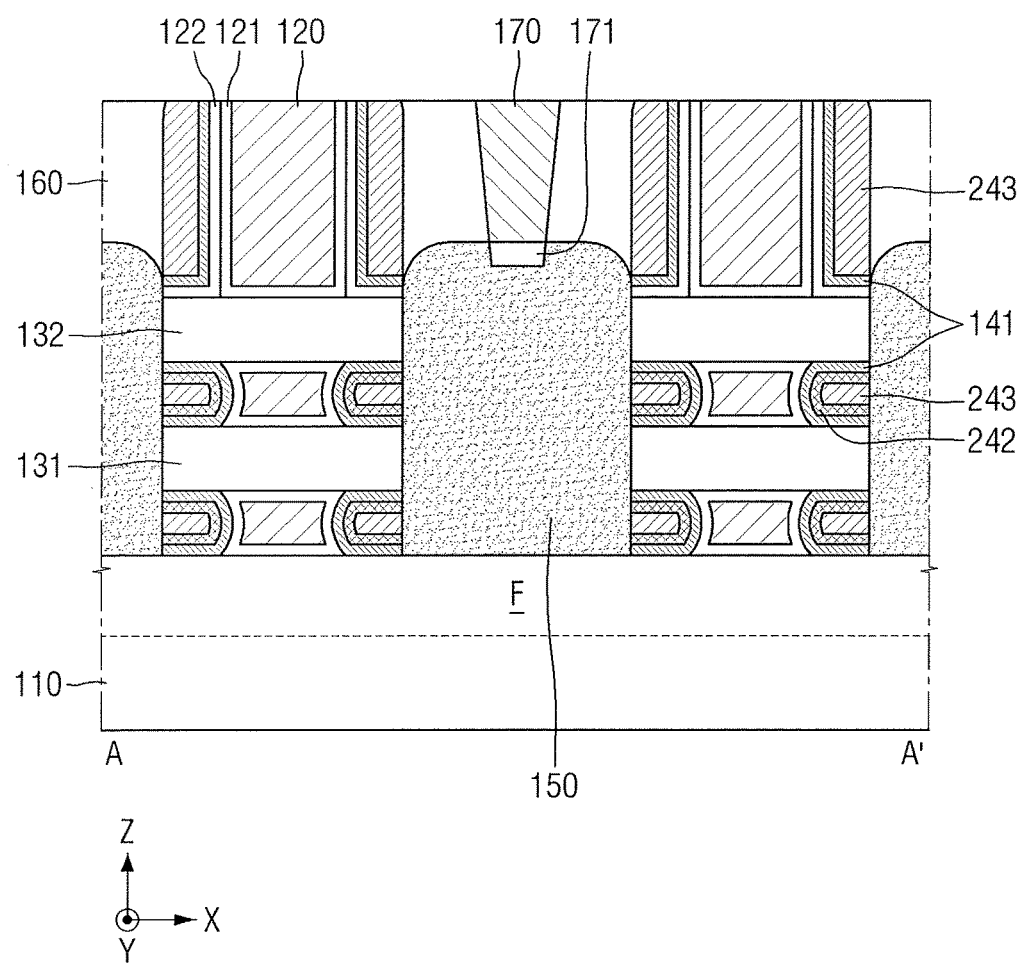
FIG. 19 illustrates a cross-sectional view of a semiconductor device according to some other exemplary embodiments of the present disclosure.

FIG. 19 is a cross-sectional view illustrating a semiconductor device according to some other exemplary embodiments of the present disclosure. FIG. 20 is a view of an intermediate step illustrating a method for fabricating a semiconductor device according to some other exemplary embodiments of the present disclosure.

Referring to FIG. 19, in the semiconductor device according to some exemplary embodiments of the present disclosure, the second spacer 242 is conformally formed on the first spacer 141 formed on the lower surface of the fin-type pattern F and the first nanowire 131. As will be described hereinbelow, in the process of forming the second spacer 242, the second spacer 242 may be formed through a dry etching process of etching a portion of the second spacer film.

Figure 20:
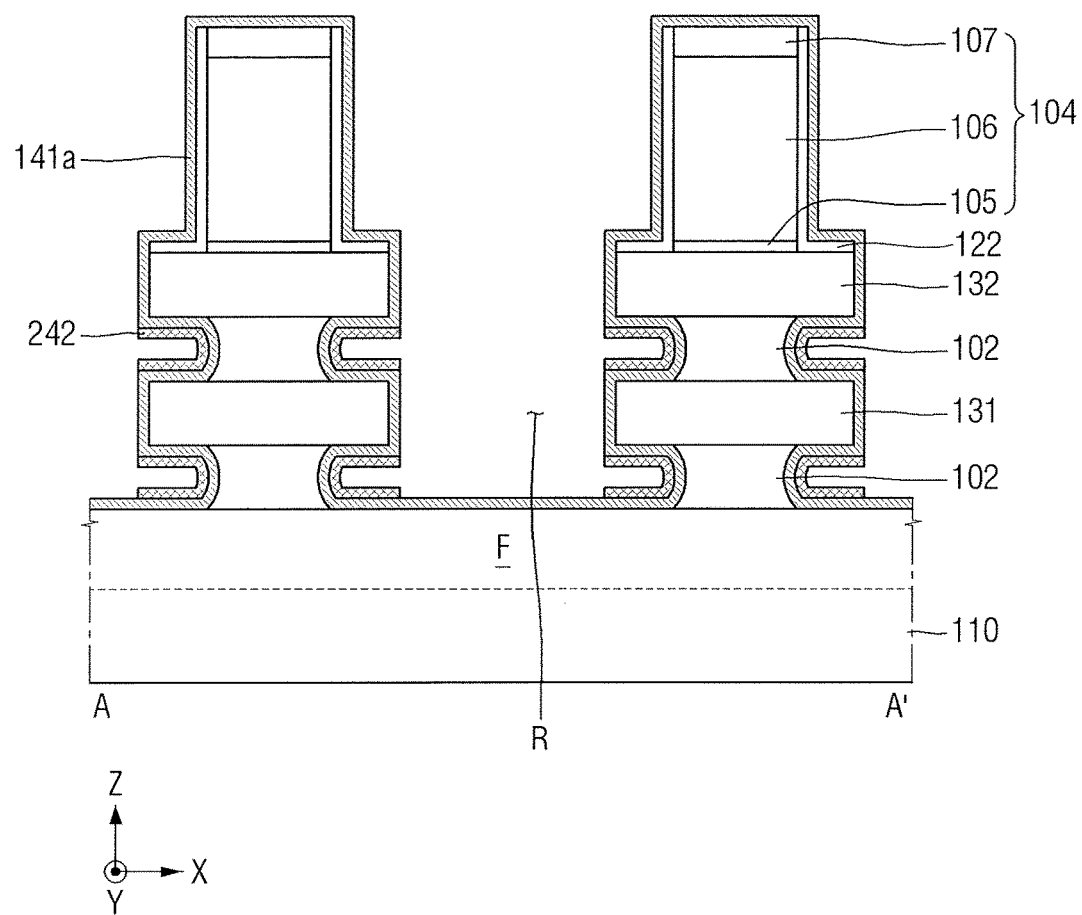
FIG. 20 illustrates a view of a stage in a method for fabricating a semiconductor device according to some other exemplary embodiments of the present disclosure.

Referring to FIG. 20, in a method for fabricating a semiconductor device according to some exemplary embodiments of the present disclosure, after performing the process illustrated in FIG. 5 to FIG. 12, a portion of the second spacer film may be removed through the dry etching process. That is, a portion of the second spacer film 242 protruding in a side surface direction farther than, e.g., beyond, the semiconductor layers may be removed by a dry etching process.

Due to the aforementioned, as illustrated in FIG. 20, a terminal end of the second spacer 242 may be aligned with the first spacer film 141a formed on the side surface of the first and second nanowires 131, 132. In this case, the first spacer 141 may include silicon carbonitride (SiCN), and the second spacer 242 may include silicon nitride (SiN). However, the present disclosure is not limited thereto. That is, in some other exemplary embodiments, the first spacer 141 may include silicon nitride (SiN), and the second spacer 242 may include silicon carbonitride (SiCN).

Hereinbelow, a semiconductor device and a method for fabricating the semiconductor device according to yet some other exemplary embodiments of the present disclosure will be explained with reference to FIG. 21 to FIG. 24. The main focus of the explanation will be on the differences between the embodiment in FIGS. 21-24 and that in FIG. 2 and FIGS. 5-18.

Figure 21:
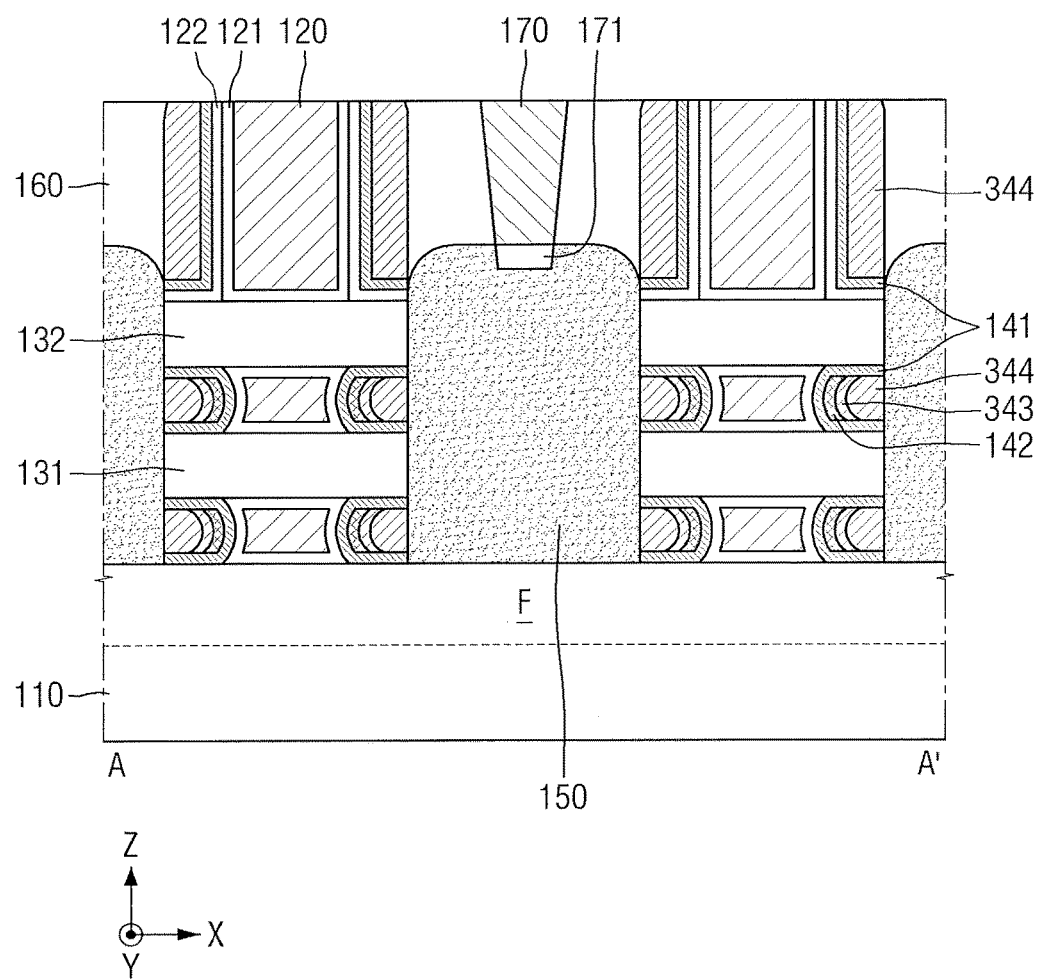
FIG. 21 illustrates a cross-sectional view of a semiconductor device according to yet some other exemplary embodiments of the present disclosure.
Figure 22:
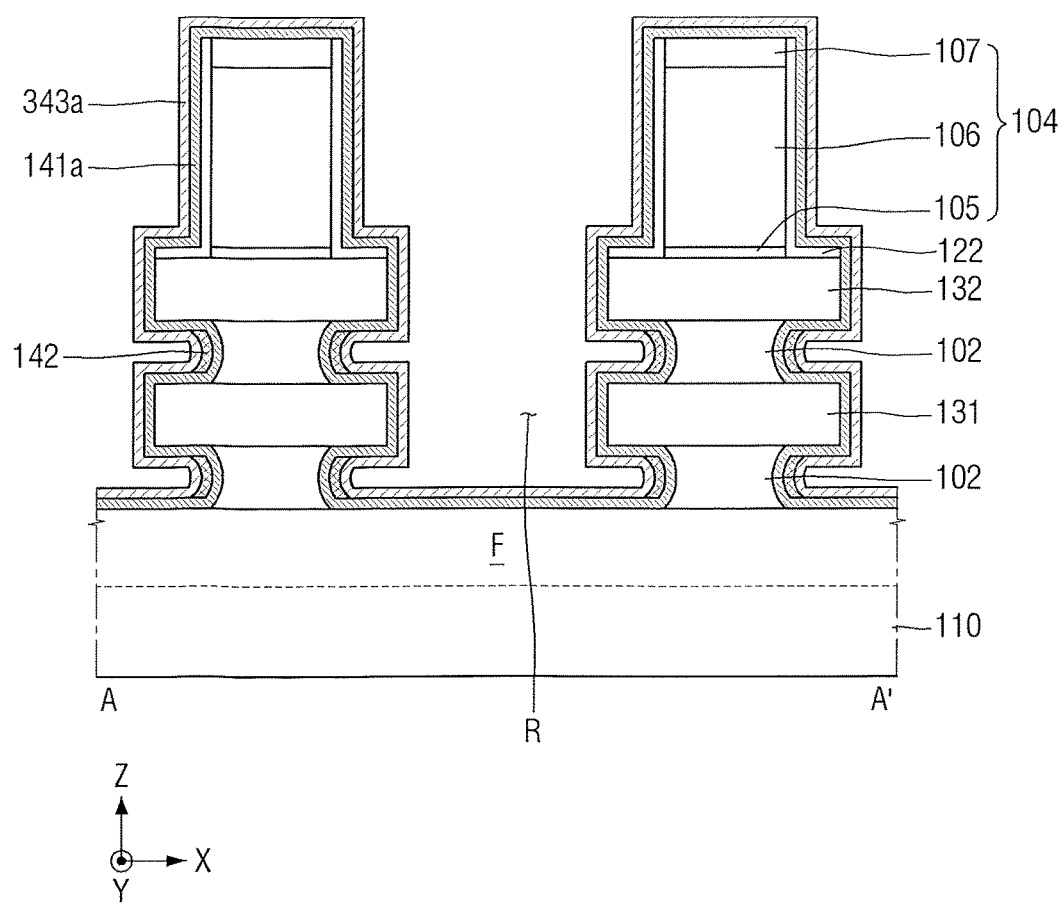
FIGS. 22 to 24 illustrate cross-sectional views of stages in a method for fabricating a semiconductor device according to yet some other exemplary embodiments of the present disclosure.
Figure 23:
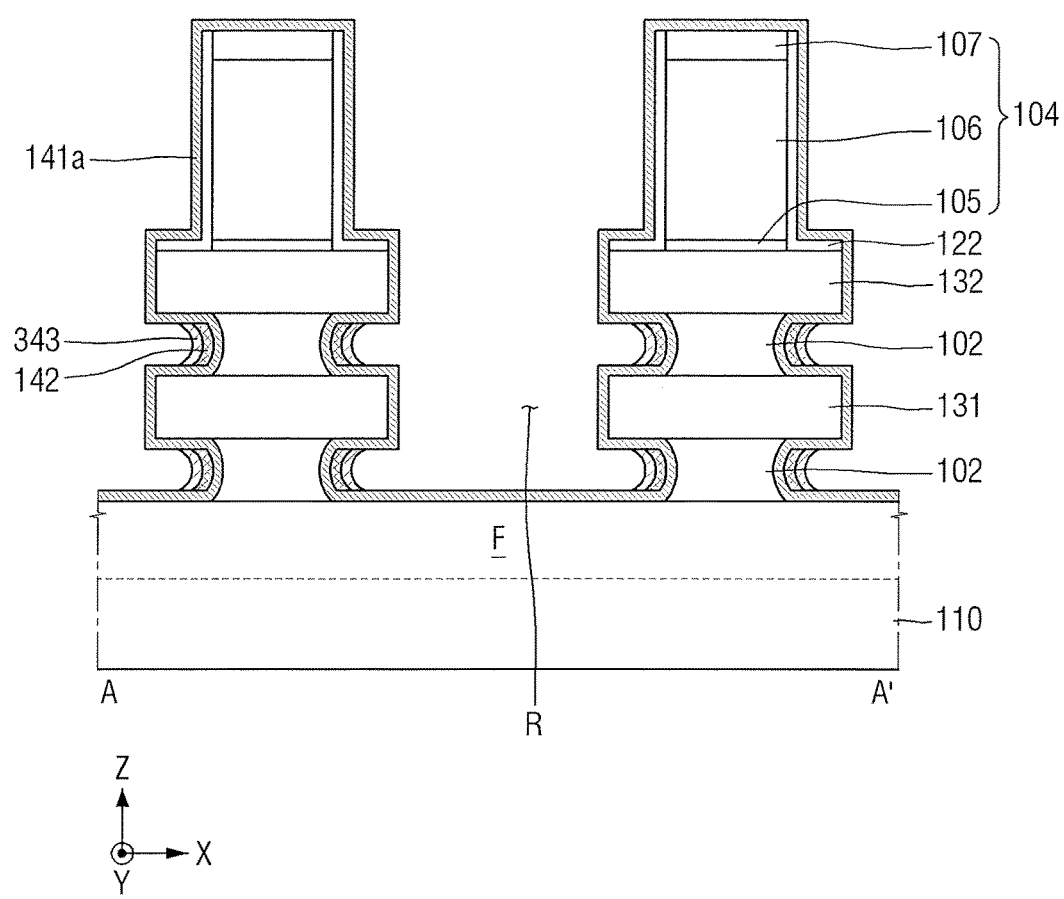
Figure 24:
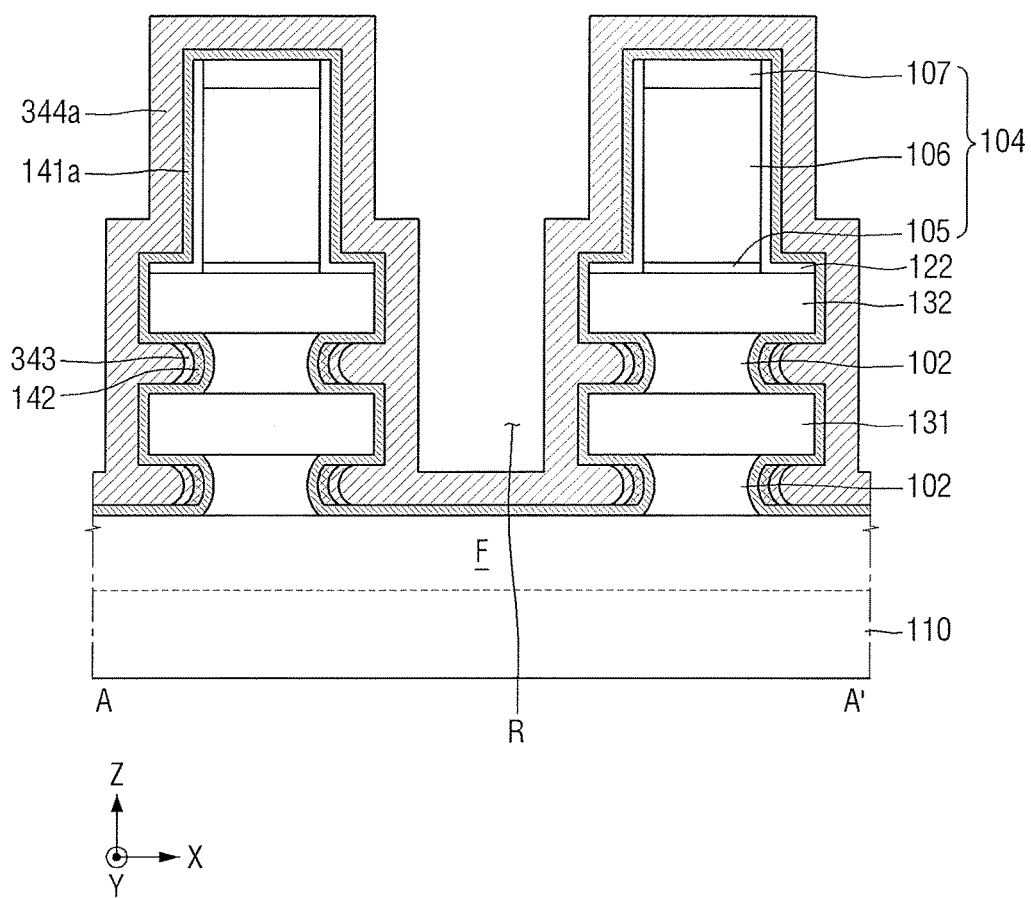

FIG. 21 is a cross-sectional view illustrating a semiconductor device according to yet some other exemplary embodiments of the present disclosure. FIG. 22 to FIG. 24 are views of intermediate steps, illustrating a method for fabricating a semiconductor device according to yet some other exemplary embodiments of the present disclosure.

Referring to FIG. 21, in a semiconductor device according to some embodiments of the present disclosure, between the fin-type pattern F and the first nanowire 131 and between the first nanowire 131 and the second nanowire 132, the spacer formed at both sides of the gate electrode 120 includes the first spacer 141, the second spacer 142, the third spacer 343, and a fourth spacer 344. In detail, between the fin-type pattern F and the first nanowire 131 and between the first nanowire 131 and the second nanowire 132, the third spacer 343 may be formed on the first spacer 141 and the second spacer 142, and the fourth spacer 344 may be formed on the third spacer 343.

In this case, the fourth spacer 344 may include the same material as the second spacer 142 and the third spacer 343. However, the present disclosure is not limited thereto.

Referring to FIG. 22, in a method for fabricating a semiconductor device according to some exemplary embodiments of the present disclosure, after performing the process illustrated in FIG. 5 to FIG. 13, the third spacer film 343a may be conformally formed on the first spacer film 141a and the second spacer 142. That is, as illustrated in FIG. 22, an empty space may be defined by the conformal structure of the third spacer film 343a.

Referring to FIG. 23, by removing a portion of the third spacer film 343a using the wet etching process, the third spacer 343 may be formed on a portion of the first spacer film 141a and on the second spacer 142. That is, as illustrated in FIG. 23, the third spacer 343 may have a same structure as that of the second spacer 142.

Referring to FIG. 24, the fourth spacer film 344a may be conformally formed on the first spacer film 141a and the third spacer 343. Through the subsequent etching process, the fourth spacer 344 may be formed on the first spacer 141 and the third spacer 343.

Hereinbelow, a semiconductor device and a method for fabricating the semiconductor device according to yet some other exemplary embodiments of the present disclosure will be explained with reference to FIG. 25 to FIG. 27. The main focus of the explanation will be on the differences between the embodiment in FIGS. 25-27 and that in FIG. 2 and FIGS. 5-18.

Figure 25:
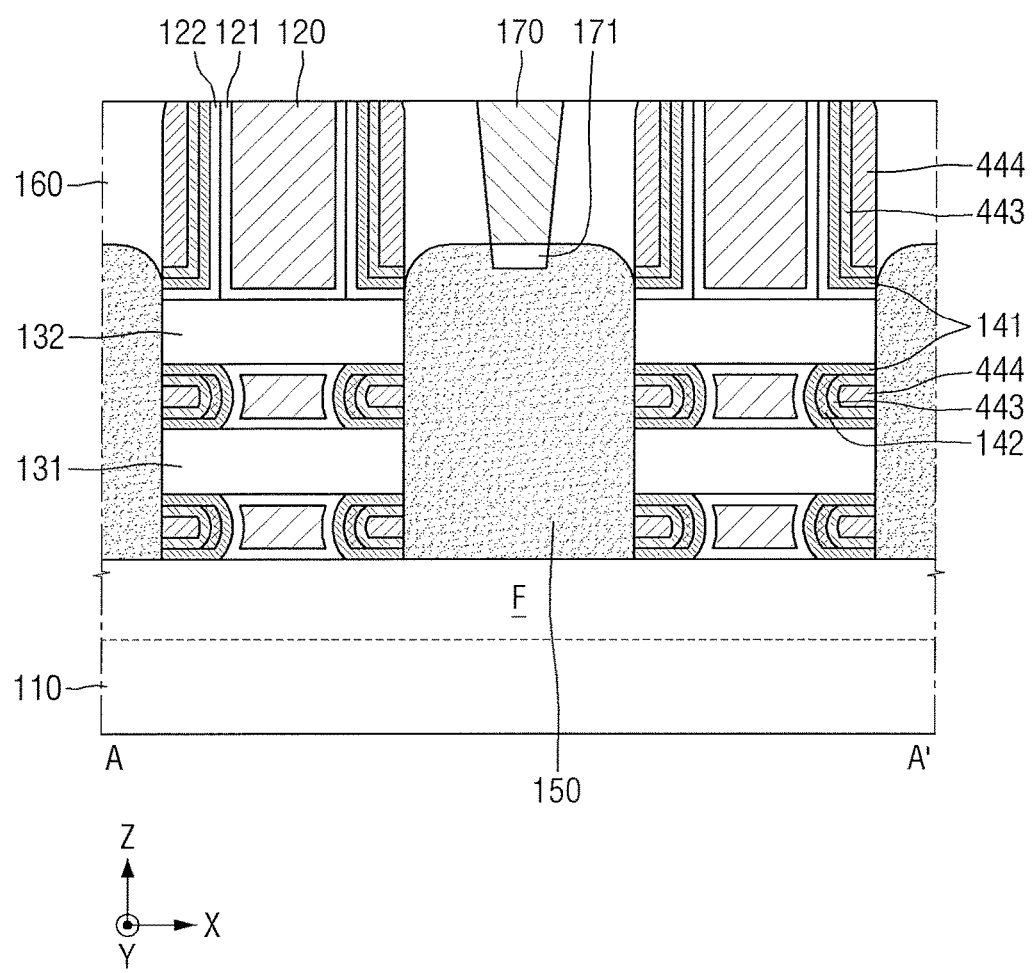
FIG. 25 illustrates a cross-sectional view of a semiconductor device according to yet some other exemplary embodiments of the present disclosure.

FIG. 25 is a cross-sectional view illustrating a semiconductor device according to yet some other exemplary embodiments of the present disclosure. FIG. 26 and FIG. 27 are views of intermediate steps, illustrating a method for fabricating a semiconductor device according to yet some other exemplary embodiments of the present disclosure.

Referring to FIG. 25, in the semiconductor device according to some exemplary embodiments of the present disclosure, the external spacer includes the first spacer 141, the third spacer 443, and the fifth spacer 444. Further, the internal spacer includes the first spacer 141, the second spacer 142, the third spacer 443, and the fifth spacer 444.

In detail, the external spacer formed within the interlayer insulating film 160 may include the first spacer 141 formed on the insulating film 122, the third spacer 443 formed on the first spacer 141, and the fifth spacer 444 formed on the third spacer 443. Further, the internal spacer formed between the fin-type pattern F and the first nanowire 131 and between the first nanowire 131 and the second nanowire 132 may include the first spacer 141, the second spacer 142 formed on the first spacer 141, the third spacer 443 formed on the first and second spacers 141, 142, and the fifth spacer 444 formed on the third spacer 443.

In this case, the third spacer 443 may include the same material as the first spacer 141, and the fifth spacer 444 may include the same material as the second spacer 142. However, the present disclosure is not limited thereto.

Figure 26:
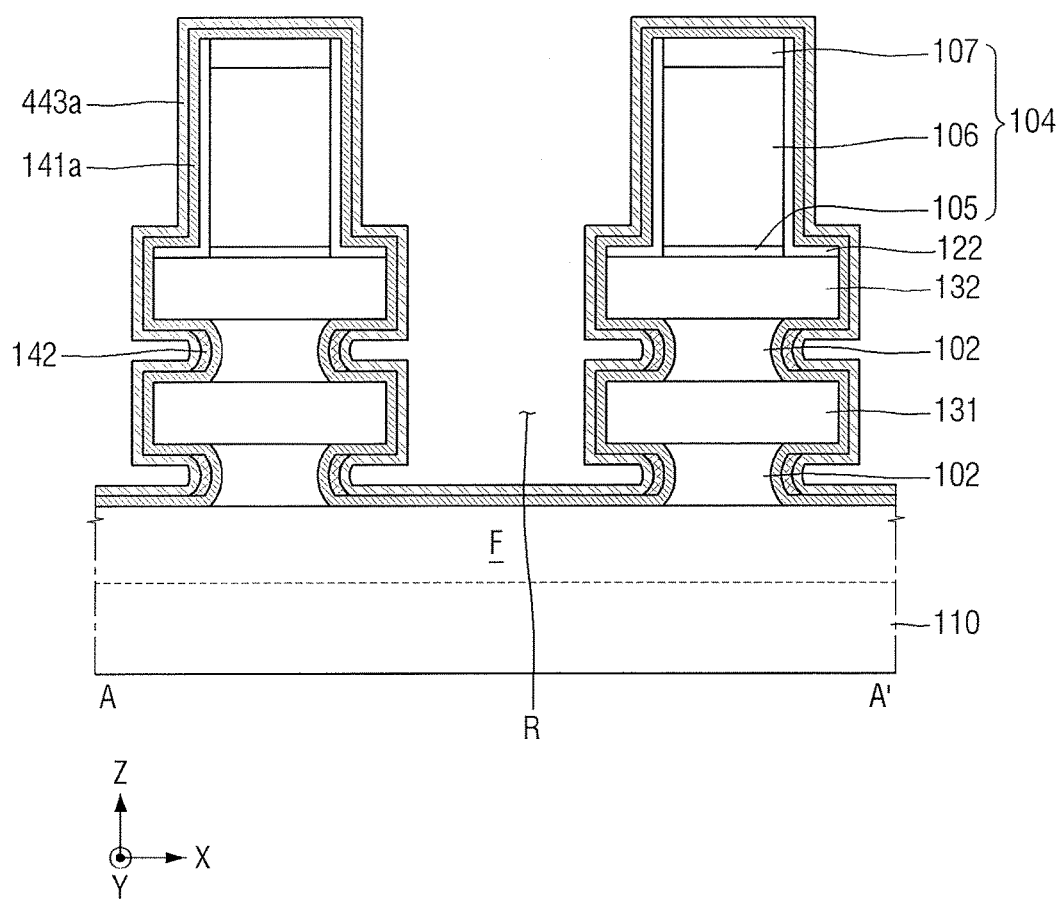
FIG. 26 and FIG. 27 illustrate cross-sectional views of stages in a method for fabricating a semiconductor device according to yet some other exemplary embodiments of the present disclosure.

Referring to FIG. 26, in a method for fabricating a semiconductor device according to some exemplary embodiments of the present disclosure, after performing the process illustrated in FIG. 5 to FIG. 13, the third spacer film 443a may be conformally formed on the first spacer film 141a and the second spacer 142. In this case, the third spacer film 443a may include the same material as the first spacer film 141a.

Figure 27:
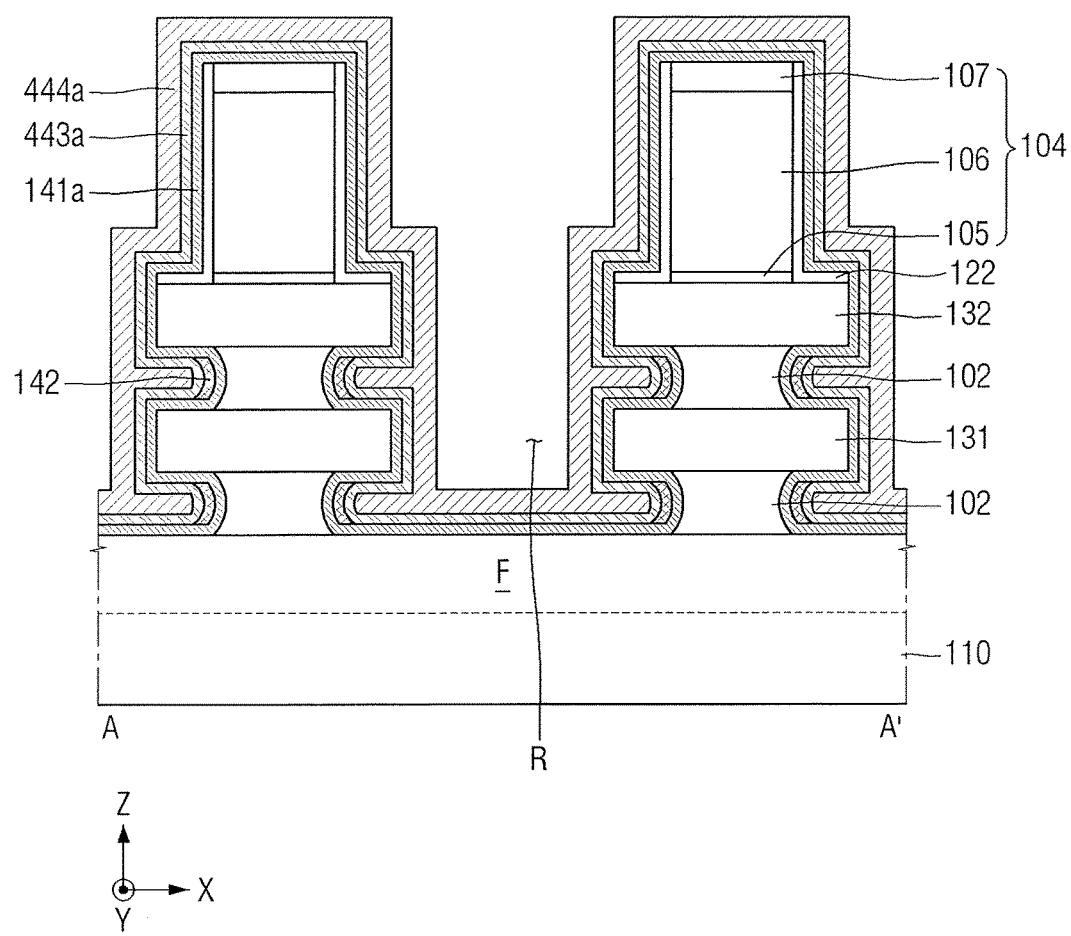

Referring to FIG. 27, the fifth spacer film 444a may be conformally formed on the third spacer film 443a. In this case, the fifth spacer film 444a may include the same material as the second spacer 142. Through the subsequent etching process, the fifth spacer 444 may be formed on the third spacer 443.

By way of summation and review, a semiconductor device and a method of manufacturing thereof according to embodiments has an internal spacer formed without a void. As such, the semiconductor device according to embodiments exhibits improved reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for fabricating a semiconductor device, the method comprising:
forming a stacked structure on a substrate, the stacked structure including at least one sacrificial layer and at least one semiconductor layer alternately stacked on the substrate;
forming a dummy gate structure on the stacked structure;
etching a recess in the stacked structure using the dummy gate structure as a mask;
etching portions of the at least one sacrificial layer exposed by the recess to form at least one etched sacrificial layer;
forming a first spacer film on the at least one etched sacrificial layer;
forming a second spacer film on the first spacer film, the second spacer film including a material different from a material of the first spacer film;
removing a first portion of the second spacer film, such that a second portion of the second spacer film remains; and
forming a third spacer film on the second portion of the second spacer film.

2. The method as claimed in claim 1, wherein forming the dummy gate structure includes:
forming a dummy gate on the stacked structure;
conformally depositing an insulating film to cover an upper surface of the stacked structure and the dummy gate;
conformally depositing a dummy gate spacer film on the insulating film; and
forming a dummy gate spacer on a sidewall of the dummy gate by etching-back the dummy gate spacer film.

3. The method as claimed in claim 1, wherein:
the at least one sacrificial layer includes a plurality of sacrificial layers, and the at least one semiconductor layer includes a plurality of semiconductor layers, and
removing the first portion of the second spacer film includes removing a portion of the second spacer film formed between adjacent ones of the plurality of the semiconductor layers using a wet etching process.

4. The method as claimed in claim 1, wherein:
the at least one sacrificial layer includes a plurality of sacrificial layers, and the at least one semiconductor layer includes a plurality of semiconductor layers, and
removing the first portion of the second spacer film includes removing a portion of the second spacer film protruding in a side surface direction farther than the plurality of the semiconductor layers using a dry etching process.

5. The method as claimed in claim 4, wherein the first spacer film includes silicon nitride (SiN), and the second spacer film includes silicon carbonitride (SiCN).

6. The method as claimed in claim 1, wherein the first spacer film includes silicon carbonitride (SiCN), and the second spacer film includes silicon nitride (SiN).

7. The method as claimed in claim 1, wherein the first spacer film includes silicon oxycarbonitride (SiOCN), and the second spacer film includes silicon oxynitride (SiON).

8. The method as claimed in claim 1, further comprising:
after forming the third spacer film, removing a first portion of the third spacer film, such that a second portion of the third spacer film remains, and
forming a fourth spacer film on the second portion of the third spacer film, the fourth spacer film including a same material as the third spacer film.

9. The method as claimed in claim 1, further comprising, after forming the third spacer film, forming a fifth spacer film on the third spacer film.

10. The method as claimed in claim 9, wherein the third spacer film includes a same material as the first spacer film, and the fifth spacer film includes a same material as the second spacer film.

11. A method for fabricating a semiconductor device, the method comprising:
forming a stacked structure on a substrate, the stacked structure including sacrificial layers and semiconductor layers alternately stacked on the substrate;
forming a dummy gate structure on the stacked structure;
etching a recess in the stacked structure using the dummy gate structure as a mask;
forming a first exposed region between adjacent ones of the semiconductor layers by etching a portion of at least one sacrificial layer between the adjacent ones of the semiconductor layers;
conformally forming a first spacer film on the at least one etched sacrificial layer and the semiconductor layers, such that the first spacer film is conformally formed on the first exposed region to define a second exposed region on the first spacer film;
conformally forming a second spacer film on the first spacer film in the second exposed region;
forming a third exposed region by etching a portion of the second spacer film in the second exposed region; and
forming a third spacer film on the first and second spacer films in the third exposed region.

12. The method as claimed in claim 11, wherein forming the third exposed region includes removing the second spacer film excluding a portion of the second spacer film formed adjacently to the sacrificial layer, such that a portion of the first spacer film is exposed.

13. The method as claimed in claim 11, wherein the first spacer film includes a material different from a material of the second spacer film.

14. The method as claimed in claim 11, wherein the third spacer film includes a same material as the second spacer film.

15. The method as claimed in claim 11, wherein the first spacer film, the second spacer film, and the third spacer film are each conformally formed by an atomic layer deposition (ALD) method.

16. A method for fabricating a semiconductor device, the method comprising:
forming a stacked structure on a substrate, the stacked structure including at least one sacrificial layer and at least one semiconductor layer alternately stacked on the substrate;
forming a dummy gate on the stacked structure;
forming a dummy gate spacer on a sidewall of the dummy gate;
etching a recess in the stacked structure using the dummy gate and the dummy gate spacer as a mask;
etching a portion of the at least one sacrificial layer exposed by the recess;
removing the dummy gate spacer;
conformally forming a first spacer film on the dummy gate, the at least one semiconductor layer, and the at least one sacrificial layer;
conformally forming a second spacer film on the first spacer film, the second spacer film including a material different from a material of the first spacer film;
removing the second spacer film excluding a portion of the second spacer film formed on a side surface of the at least one sacrificial layer; and
forming a third spacer film on the first spacer film and the second spacer film.

17. The method as claimed in claim 16, further comprising, after forming the third spacer film, etching the first and third spacer films formed on a side surface of the at least one semiconductor layer to expose the side surface of the at least one semiconductor layer by the recess.

18. The method as claimed in claim 17, further comprising, after forming the first and third spacer films formed on the side surface of the at least one semiconductor layer:
forming a source/drain on the recess;
removing the dummy gate and the at least one sacrificial layer; and
forming a gate electrode to surround the at least one semiconductor layer.

19. The method as claimed in claim 16, wherein forming the dummy gate spacer includes:
conformally depositing an insulating film to cover an upper surface of the stacked structure and the dummy gate;
conformally depositing a dummy gate spacer film on the insulating film; and
forming the dummy gate spacer on the sidewall of the dummy gate by etching-back the dummy gate spacer film.

20. The method as claimed in claim 16, wherein the first spacer film includes silicon carbonitride (SiCN), and each of the second spacer film and the third spacer film includes silicon nitride (SiN).

* * * * *